United States Patent [19]

Okuno

[11] Patent Number: 5,872,461

[45] Date of Patent: Feb. 16, 1999

[54] CURRENT BYPASS CIRCUIT USED IN A SEMICONDUCTOR INTEGRATED CIRCUIT

[75] Inventor: Hirohide Okuno, Tokyo, Japan

[73] Assignees: Mitsubishi Denki Kabushiki Kaisha; Mitsubishi Electric Engineering Co., Ltd., both of Tokyo, Japan

[21] Appl. No.: 808,967

[22] Filed: Feb. 19, 1997

[30] Foreign Application Priority Data

Aug. 30, 1996 [JP] Japan ................................ 8-230547

[51] Int. Cl.$^6$ ............................................ H03K 15/003
[52] U.S. Cl. ................................ 326/9; 326/33; 327/493
[58] Field of Search ................................ 326/81, 84, 31, 326/34; 327/493; 361/91

[56] References Cited

U.S. PATENT DOCUMENTS

| | | |
|---|---|---|
| 4,922,367 | 5/1990 | Hidaka . |
| 5,237,211 | 8/1993 | Tanaka et al. ........................... 307/249 |
| 5,300,765 | 4/1994 | Mizuta . |
| 5,398,148 | 3/1995 | Perkins et al. ............................ 361/18 |
| 5,418,472 | 5/1995 | Moench ................................... 326/14 |

FOREIGN PATENT DOCUMENTS 542852 6/1993 Japan .

Primary Examiner—Jon Santamauro
Assistant Examiner—Don Phu Le
Attorney, Agent, or Firm—Leydig, Voit & Mayer

[57] ABSTRACT

A current bypass circuit used in a semiconductor integrated circuit supplied with power from power sources having respective different DC voltages in relation to a reference potential, a p type (or n type) substrate of the semiconductor integrated circuit being connected to the reference potential, includes a current switching circuit and a voltage level detecting circuit. The current switching circuit is connected between the reference potential and the DC voltage source for switching between a conductive state and a cutoff state. The voltage level detecting circuit is connected to a control power source that maintains the current switching circuit in a conductive state when the voltage appearing across both terminals of the current switching circuit is equal or lower than a predetermined voltage. The voltage level detecting circuit cuts-off the current switching circuit when the voltage across both terminals of the current switching circuit exceeds a predetermined value. Thereby, needed isolation between the elements in the semiconductor integrated circuit is provided.

7 Claims, 14 Drawing Sheets

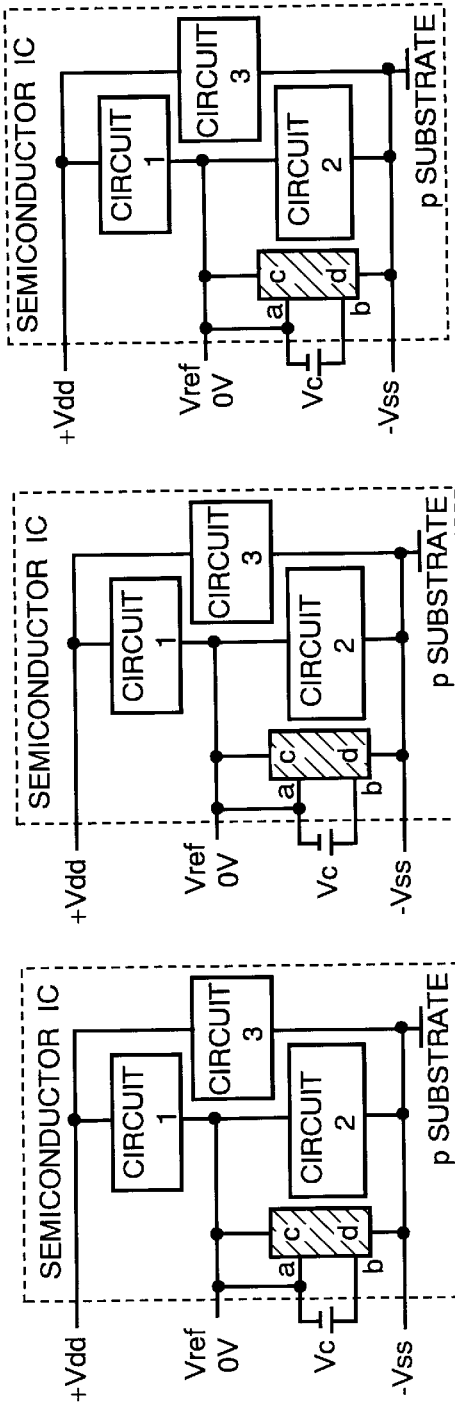

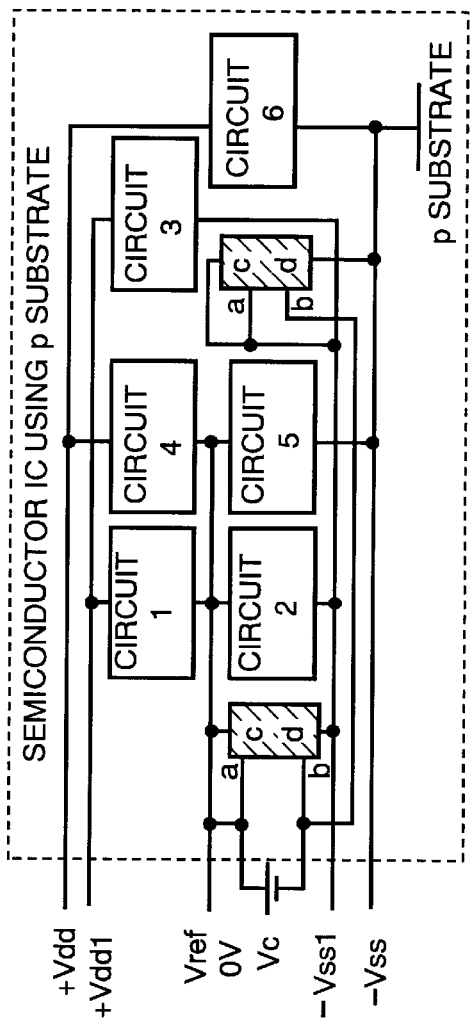
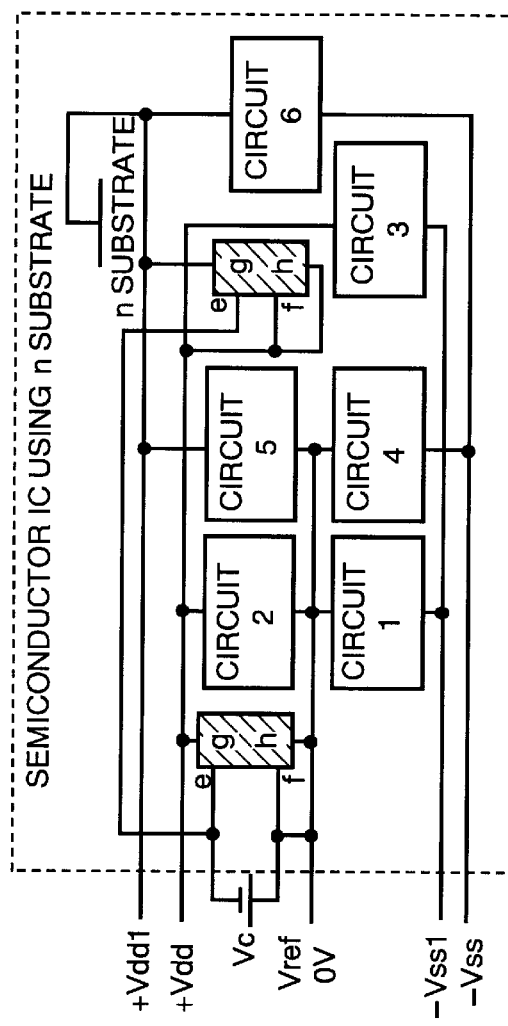
FIG. 10A
FIG. 10B

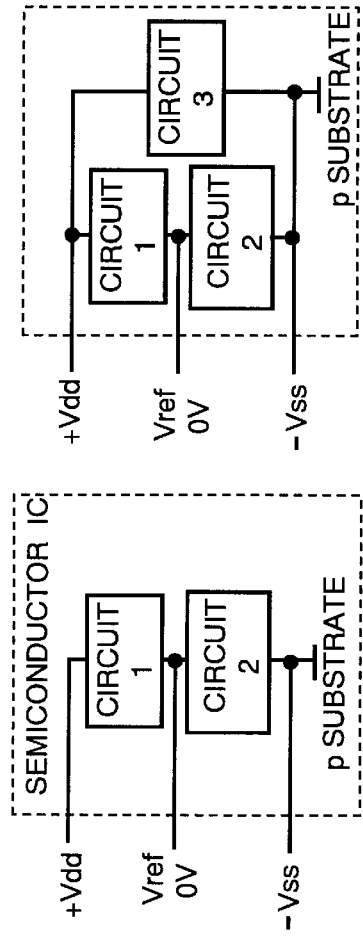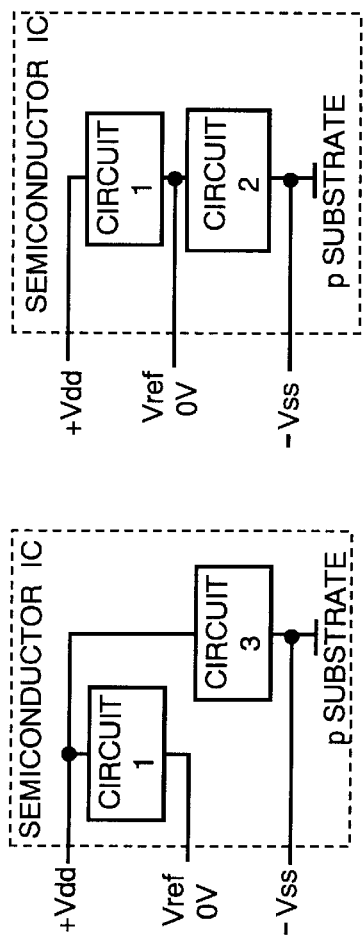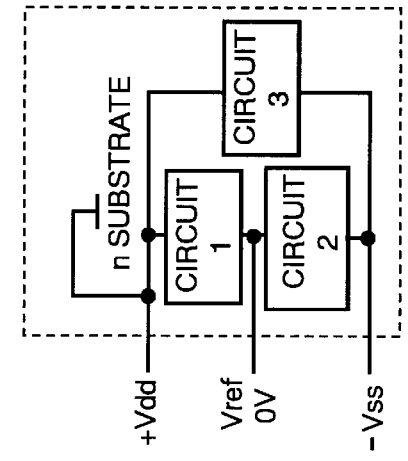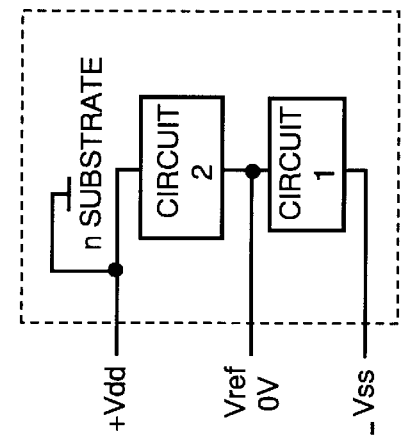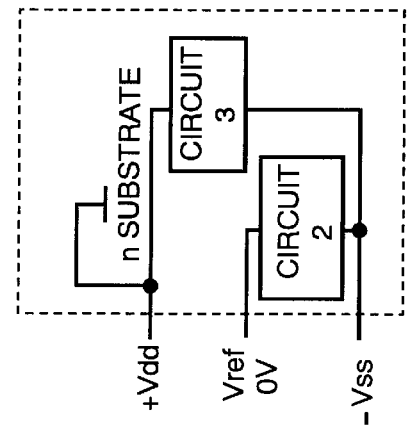

CURRENT BYPASS CIRCUIT USED IN A SEMICONDUCTOR INTEGRATED CIRCUIT

BACKGROUND OF THE INVENTION

1. Field of the invention

This invention relates to a semiconductor integrated circuit which receives electrical power at different direct current voltages. More particularly, the invention relates to a semiconductor integrated circuit for preventing deterioration of or damage to elements due to abnormal currents that can occur in a transient state, when a direct current is turned on and off in a semiconductor integrated circuit.

2. Description of the Prior art

It has been made possible to integrate a plurality of functions, implemented by several semiconductor circuits, into one semiconductor device or one monolithic semiconductor integrated circuit, by the introduction of the large scale semiconductor integrated circuit. Thus, the number of parts and size has decreased, and price and electrical power consumption have been lowered, while performance has been improved. This trend is accelerating, and much effort is being made to remove even one part from an electrical device. By integrating as many functions as possible into one semiconductor device, the number of electrical parts has been reduced.

In the past, semiconductor devices with different constructions were produced on respective independent substrates. Thus, the reduction in the number of parts has been limited. However, semiconductor devices having different constructions, such as identical substrate Bi-CMOS (Bipolar-Complementary Metal Oxide Semiconductor) are easily produced at the present time. In this way, a large scale integrated circuit (LSI) has become of use with the advantages of bipolar transistors, such as analog processing ability, high current driving ability, and high speed operation and also the advantages of CMOS, such as high density integration and low power consumption, which helps to achieve the objects described above. However, in the case of an analog-digital hybrid circuit, such as a Bi-CMOS circuit, a CMOS logic circuit normally requires a positive power source, an analog circuit normally requires both positive and negative power supplies, and bipolar ECL (Emitter Coupled Logic) normally requires a negative power source for a reference potential, Vref. Generally, an input-output voltage of a CMOS logic circuit requires a positive voltage, an input-output voltage of an analog circuit requires both positive and negative voltages, and an input-output voltage of an ECL circuit requires a negative voltage. In a case like this where constructions and circuit systems differ, it is impossible to drive respective circuits with a single voltage, and it is necessary to provide power supplies with a different polarity or voltages compared to the reference potential Vref, according to circuit requirements.

FIGS. 11A–11F show a circuit block integrated into a single semiconductor circuit substrate. FIGS. 11A–11C show cases of a p-type substrate, and FIGS. 11D–FIG. 11F show cases of an n-type substrate. In FIGS. 11A–11F, frames drawn with dotted lines show portions of a semiconductor integrated circuit on the same substrate. A positive voltage +Vdd and a negative voltage −Vss, compared to the reference potential Vref, are supplied from the outside. Circuits 1, 2, and 3 are CMOS circuits, other MOS circuits, and logic circuits or analog circuits, including ECL bipolar elements, as described above.

In the past, in semiconductor integrated circuits that receive electrical power from the different DC (direct current) voltage power sources, compared to the reference potential Vref, and use the reference potential Vref, there have been cases in which the on-off sequence of the different power sources had to be decided prior to use. In addition, when the on-off sequence of the different power sources cannot be assigned, some measures are needed between the power source circuit and the semiconductor Integrated circuit.

When semiconductor integrated circuits are formed on one silicon substrate, even in the described BI-CMOS semiconductor integrated circuit, circuit elements on a p-type silicon substrate are mutually connected inside the circuit. The method normally used to isolate the Integrated circuits is a pn junction. In this method, elements are normally isolated by applying a reverse bias voltage to a pn junction. If a p-type (or an n-type) silicon substrate is employed in order to apply the reverse bias voltage to the pn junction, a minimum electric potential (or a maximum electric potential) is given to the substrate. If this condition cannot be satisfied, a parasitic circuit is secondarily activated in the designed elements. In a CMOS circuit, the activation causes latch-up, and excessive current flows into elements and wires and may cause deterioration or breakage. In the case of a bipolar circuit, activation of a parasitic element causes heating in labyrinthine circuits, sometimes causing deterioration of or damage to elements. In recent years, design technology has improved, and latch-up and deterioration of or damage to the elements has become rare. However, since the construction potentially Includes the phenomenon described above, depending on the on-off sequence of different power sources, protection is needed when the circuits are turned on or turned off.

FIG. 12 shows a sectional view of a simple Bi-CMOS Integrated circuit in a p-type substrate of a semiconductor integrated circuit. In FIG. 12 the circuit comprises internal electrical elements, power supplies providing voltages +Vdd and −Vss, and switches S1 and S2, which turn on or off the power source current, an input "in 1" of the CMOS circuit and an input "In 2" of the bipolar circuit. FIGS. 13A and 13B show electrical equivalent circuits of the structure of FIG. 12. Unimportant resistors and other elements are omitted in FIGS. 12, 13A, and 13B. In FIGS. 12, 13A, and 13B, p channel transistors T1 and n channel transistors T2 form the CMOS circuit, and npn transistors T3 and resistors R4 and R5, formed by diffusion, form the bipolar circuits. In FIGS. 13A and 13B, the single dot dashed line shows the designed circuit and the double dot dashed line shows the parasitic circuits. In FIGS. 13A and 13B, transistors Q1, Q2, Q3, Q4, and Q5, and resistors R1, R2, R3, and R4 are secondary parasitic elements. The application of the power supply voltages to these parasitic circuits is explained below.

FIG. 13A shows a normal case where the switch S2 is turned on prior to the switch S1, according to a normal sequence of power sources. In FIG. 13A, the switch S1 is opened, and the switch S2 is closed to apply a voltage −Vss to the parasitic circuits. Since the voltage −Vss, which is a reverse voltage, is applied to the p-type substrate, current does not flow in the parasitic circuit. That is, the negative voltage −Vss is applied to the base of the transistor Q3, as shown by the arrow V, and a ground potential, which is the reference potential Vref (potential 0), is applied to the emitter of the transistor Q3, as shown by the arrow U. Thus, the junction between the base and the emitter is in a reverse bias state, so current does not flow from the base to the emitter. The junction between the collector and the emitter of the parasitic npn transistor Q3 is in a non-conductive state. Hence, the parasitic circuit does not have any influence on the designed circuit, and the designed circuit operates as expected. Further, when the switch S1 is closed, the designed circuit enters a normal operational condition.

FIG. 13B shows an abnormal case where the switch S1 is turned on prior to the switch S2, which is a reverse sequence for applying the voltages. In FIG. 13B, the switch S1 is open, and the switch S2 is closed to apply the voltage +Vdd to the circuit. At this time, the p-type substrate is at a high electric potential compared to the reference potential Vref. A current flows from the voltage +Vdd to the ground as shown by an arrow W, through the resistors R4 and R5, the parasitic transistor Q5, parasitic resistors R3 and R2, and the base and the emitter of the parasitic npn transistor Q3. As a result, a path between the collector and the emitter of the parasitic npn transistor Q3 becomes conductive, and the electric potential of the base of the parasitic pnp transistor Q4 decreases.

Therefore, the current flows from the emitter to the base of the parasitic pnp transistor Q4 as shown by an arrow X, the path between the emitter and the collector of the parasitic pnp transistor Q4 becomes conductive, and the current flows from the base to the emitter of the parasitic npn transistor Q3, as shown by an arrow Y. Once this condition is achieved, the currents flow continuously through the transistors Q4 and Q3 as shown by arrows Y and Z, even if the current flow shown by an arrow W stops. As a result, the current path becomes warm, and elements might deteriorate or be damaged, which is referred to as a latch-up. Hence, normal operation cannot be ensured when the switch S2 is closed. In this manner, if the sequence for supplying the voltage is different from the normal sequence, problems could occur as explained above.

However, it is understandable that this kind of problem does not occur if the electric potential of the substrate Is maintained at the reference potential Vref, that is, the minimum electric potential. In other words, in FIG. 13B, if the substrate voltage is lower than around +0.3V, the current between the base and the emitter of the parasitic npn transistor Q3 hardly flows, and thus it seems possible to avoid problems such as explained above. However, the occurrence of the latch-up phenomenon depends on the pattern layout of the respective circuit elements, electric characteristics, and ambient temperature characteristics. Therefore, the pattern layout has to be designed with enough caution, just as in the conventional layout. If the switch S1 and the switch S2 are closed simultaneously, whether the latch-up phenomenon will result depends on the circuits, the pattern layout, and the electric characteristics of the elements.

As described above, when power is supplied to a monolithic semiconductor circuit which requires different DC voltage power sources, special attention is needed when turning on or turning off the power sources. If the substrate potential is unstable in a circuit with bipolar elements, the parasitic elements activate, depending on the layout of elements or circuit construction, which causes an abnormal current. As shown in the frames drawn with the dashed line in FIG. 13A or FIG. 13B, even in a simple circuit which is designed from resistors R4 and R5, and an npn transistor T3, a more complex circuit is secondarily formed by parasitic elements. In order not to active these parasitic elements, it is necessary to constantly maintain the electric potential of the substrate at the minimum electric potential. In order to maintain the electric potential, special attention is needed so that the electric potential of the substrate does not rise when the pattern layout is designed. If not, there is a possibility that the parasitic elements will be activated. In the frames drawn with double dot dash lines in FIGS. 13A and 13B, the parasitic circuit formed by the parasitic transistors Q1 and Q5 is similar to the previously described parasitic circuit formed by pnp transistor Q4 and npn transistor Q3. Therefore, when the electric potential of the substrate rises locally, excessive current may flow into the elements and even into the bipolar circuit.

As shown in FIGS. 11A–11F, when a plurality of circuits are formed on the same substrate, when voltages are supplied to a semiconductor integrated circuit using a p-type substrate (or an n-type substrate), it is preferable to apply a voltage −Vss prior to applying +Vdd (or +Vdd prior to −Vss). When disconnecting the voltage, it is preferable to disconnect voltage +Vdd prior to disconnecting voltage −Vss (or −Vss prior to +Vdd). FIG. 14A and FIG. 14B are timing charts showing a desired sequence of the turning on and turning off, and FIG. 15A and FIG. 15B are timing charts showing an undesired sequence of the turning on and turning off.

As described above, FIGS. 13A and 13B show circuits where a circuit 1 in FIG. 11A corresponds to a CMOS circuit comprising T1 and T2, a circuit 3 corresponds to a bipolar circuit comprising T3. As explained above, FIG. 13A illustrates a normal conventional power source voltage supplying sequence, while FIG. 13B illustrates an abnormal conventional power source voltage supplying sequence. Electrically, it is noteworthy that current flows from the base to the emitter of the parasitic npn transistor Q3 in the parasitic circuit in FIG. 13B, that is to say, the path between the collector and the emitter of the parasitic npn transistor Q3 becomes conductive, while current does not flow from the base to the emitter of the parasitic npn transistor Q3 in the parasitic circuit in FIG. 13A.

Abnormal current in the parasitic element is caused when the substrate electric potential exceeds the reference potential Vref. Especially when a silicon substrate is employed, once the substrate electric potential exceeds the reference potential Vref by the amount of a forward voltage (for example, about 0.7V), enough current to activate the parasitic circuit starts flowing. Thus, it is important to maintain the value of the substrate electric potential at a low level.

As explained above, a conventional semiconductor integrated circuit requires different direct current power sources. In such circuits, if the on-off sequence of the power supply sources is incorrect, some semiconductor integrated circuits suffer serious problems, such as deterioration or damage. In the past, in order to avoid such deterioration or damage from an abnormal current occurrence, the power source comprises a voltage on-off circuit. However, the voltage on-off circuit is very complicated, which makes the power source circuit expensive.

SUMMARY OF THE INVENTION

It is an object of the present invention to solve the problem described above. The invention simplifies the power source circuit by omitting a sequence circuit for controlling the on-off sequence of the voltage source. That is, the invention provides a semiconductor integrated circuit comprising a current bypass circuit enabling stable operation without deterioration of or damage to the elements in the semiconductor integrated circuit if the on-off sequence of the power source is different from the normal sequence. In the present invention, the control power source is supplied from outside the semiconductor integrated circuit, whereby the present invention maintains the current bypass circuit In a conductive condition, and effectively ensures stable operation at the time of turning on and turning off of the power source.

It is a further object of the present invention to provide a current bypass circuit used in a semiconductor integrated circuit for preventing the electric potential from rising to a potential where the parasitic elements are activated. For example, the object is achieved by integrating a bypass circuit for maintaining the substrate electric potential of a p-type substrate substantially at a minimum potential, and, for a semiconductor Integrated circuit using an n-type substrate, at a maximum potential.

According to one aspect of the invention, a current bypass circuit used in a semiconductor Integrated circuit which is supplied with power from power sources having respective different DC voltages relative to a reference potential, wherein a p-type (or n-type) substrate of the semiconductor integrated circuit has applied to it and the reference potential, comprises a current switching circuit and a voltage level detecting circuit. The current switching circuit is connected between the reference potential and the DC voltage source for changing to a conductive state or to a cut-off state. The voltage level detecting circuit connected to a control power source maintains the current switching circuit in a conductive state when the voltage across the terminals of the current switching circuit is equal or lower than a threshold value. The voltage level detecting circuit further cuts-off the current switching circuit when the voltage across the terminals of the current switching circuit exceeds a threshold value. Thereby, the isolation needed between the elements in the semiconductor integrated circuit is obtained.

According to another aspect of the invention, a current bypass circuit used in a semiconductor integrated circuit which is supplied with power from power sources having respective different DC voltages relative to a reference potential, wherein a p-type (or n-type) substrate of the semiconductor integrated circuit has applied to it the reference potential, comprises a current switching circuit connected between the reference potential and the DC voltage source for making conductive or cut-off therebetween; a current switching circuit connected between the reference potential and the DC voltage source for connection or disconnection; a voltage level detecting circuit connected to a control power source for maintaining the current switching circuit in a conductive state when the voltage appearing across the terminals of the current switching circuit is equal or lower than a switching voltage of the active elements, and for cutting-off the current switching circuit when the voltage across the terminals of the current switching circuit exceeds a switching voltage of the active elements, in order to obtain the isolation needed between the elements in the semiconductor integrated circuit.

According to a further aspect of the invention, a current bypass circuit used in a semiconductor integrated circuit comprises a control signal generating circuit generating a control signal for controlling the switching circuit to be conductive when the voltage appearing across the terminals of the current switching circuit is equal or lower than a switching voltage of the active elements. The control signal generating circuit further controls the switching circuit to be in a cut-off state when the voltage appearing across the terminals of the current switching circuit exceeds a switching voltage of the active elements.

According to a further aspect of the invention, a current bypass circuit used in a semiconductor integrated circuit comprises a first terminal connected to a reference potential, a second terminal connected to a substrate, third and fourth terminals connected to a control voltage supply, a current switching circuit, and a control circuit. The current switching circuit comprises a first MOS transistor with its drain and source connected to any one of the respective first and second terminal and its gate connected to any one of the third or fourth terminals via a resistance element for turning on and turning off according to the control signal from the control circuit. The control circuit comprises a second MOS transistor with a gate connected to the control voltage supply for sending a control signal that changes the current switching circuit to be conductive when an input voltage applied across the terminals of the current switching circuit is equal to or lower than a switching voltage of the first MOS transistor. The control signal further changes the current switching circuit to a cut-off state when there is no voltage across the terminals of the current switching circuit.

BRIEF DESCRIPTION OF THE DRAWINGS

FIGS. 8A–8F show respective semiconductor integrated circuits with the current bypass circuit according to the third embodiment of the present invention.

FIGS. 10A and 10B show other respective semiconductor integrated circuits with the current bypass circuit according to the third embodiment of the present invention.

FIGS. 11A–11F show respective circuits integrated into a conventional semiconductor integrated circuit.

DETAILED DESCRIPTION OF THE PREFERRED EMBODIMENTS

Figures 1A, 1B:
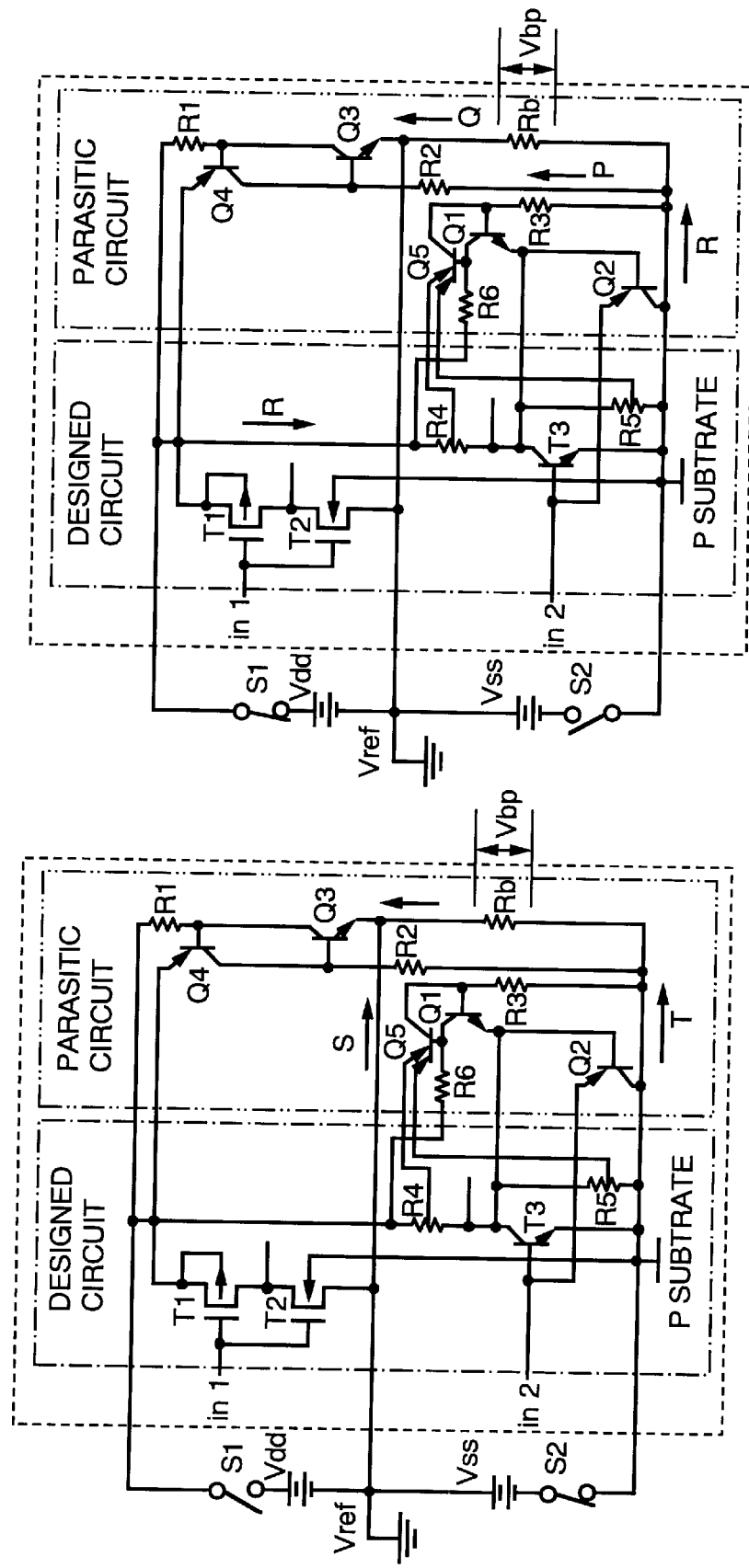
FIGS. 1A and 1B explain a principle of the present invention with the illustration of the operation of a current bypass circuit using a resistor.

FIGS. 1A and 1B explain a principle of the present invention with the illustration of the operation of a current bypass circuit using a resistor. FIGS. 1A and 1B are different from FIGS. 13A and 13B in that a resistor Rb is added between the p-type substrate and the emitter of the transistor Q3, and the voltage across the resistor Rb is Vbp.

In FIGS. 1A and 1B, it is assumed that the voltage drop across the resistor Rb and the direction of the voltage across the resistor are detected, so the resistance of this resistor Rb can be changed to a low resistance or a high resistance. In the later description, equivalent functions are realized using a current bypass circuit using active elements. This current bypass circuit is integrated into a semiconductor integrated circuit.

Figure 13B:
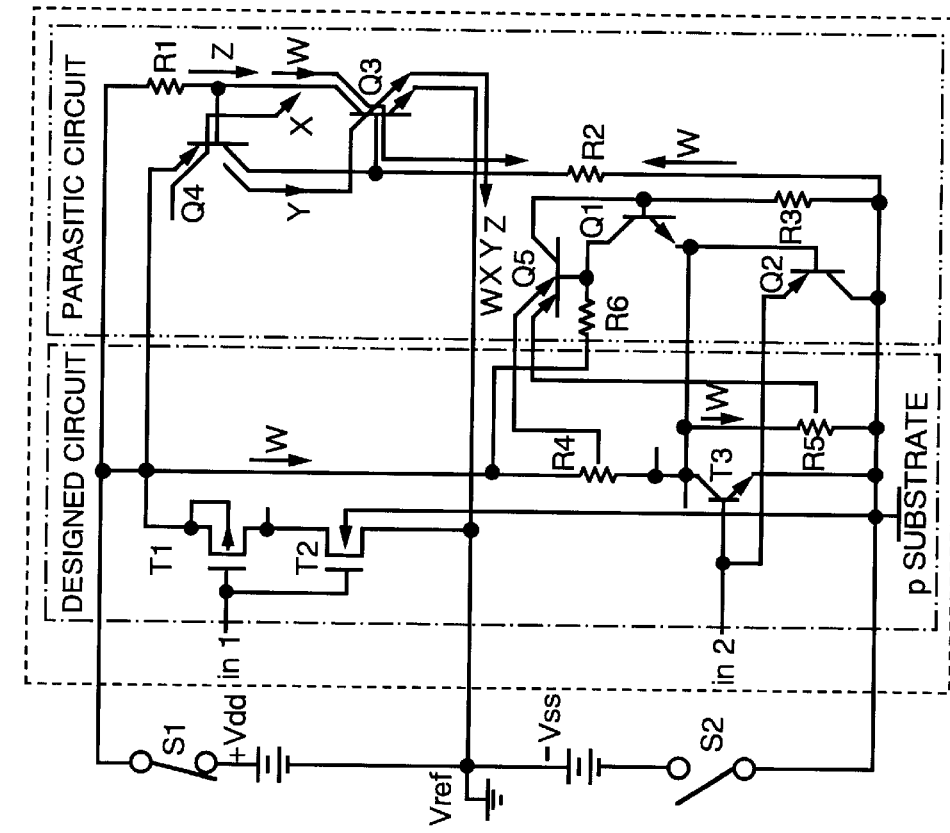
FIGS. 13A and 13B show equivalent circuits in relation to the construction illustrated in FIG. 12.
Figure 13A:
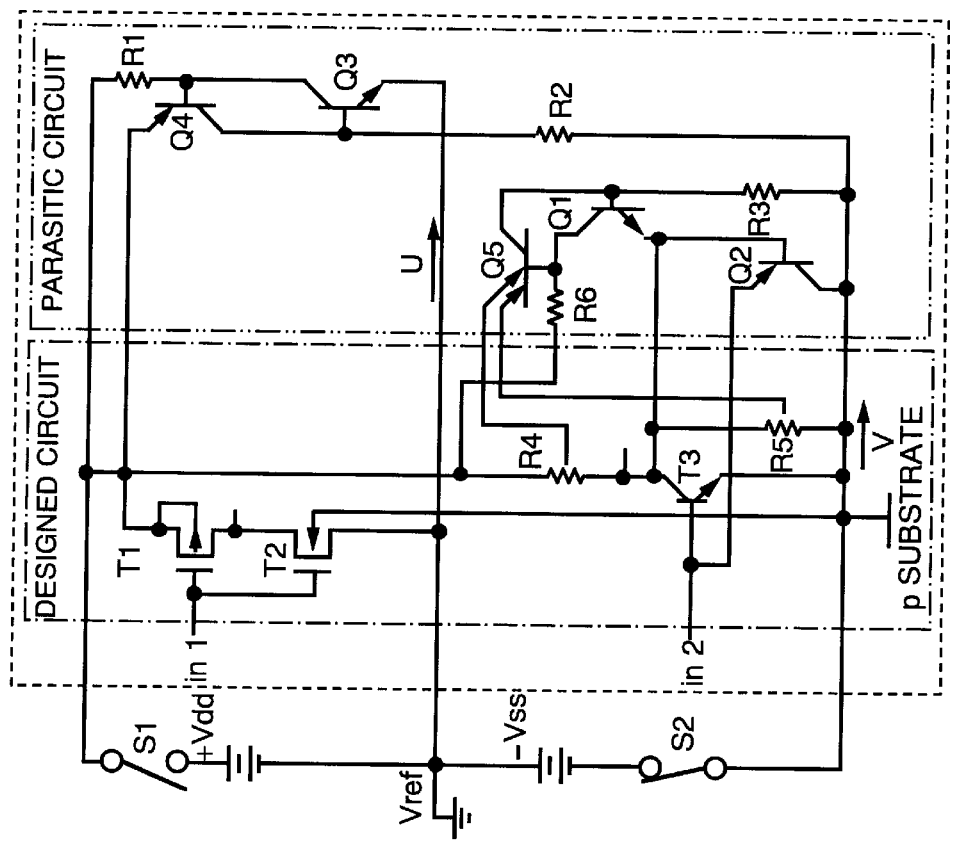

In order to compare the normal operation of the circuit in FIG. 1A with the normal operation of the conventional circuit shown in FIG. 13A, the following explanation is provided for the case when the switch S2 in FIG. 1A is turned on prior to turning on of the switch S1 in the same condition as that of FIG. 13A. In FIG. 1A, it is assumed that the resistor Rb has a low resistance before turning on of the switches S1 and 52. In the next step, it is assumed that the switch S2 is closed to apply a voltage −Vss to the circuit, while the switch S1 is left open. It is also assumed that the resistance of the resistor Rb increases when the input of voltage −Vss is detected. Thus, there is less power consumption by the resistor Rb. The voltage potential of the p-type substrate becomes a voltage −Vss in comparison with the reference potential Vref, and a reverse voltage is applied to the parasitic circuit. A negative voltage is applied to the base of the parasitic npn transistor Q3 as shown by an arrow T, and the reference potential Vref (0 V) is applied to the emitter as shown by an arrow S. Therefore the voltage between the base and the emitter becomes a reverse bias. Because current does not flow from the base to the emitter, the path between the collector and emitter is non-conductive. Therefore, the parasitic circuit does not have any influence on the circuit caused by the on-off sequence of the switches S1 and S2, and the circuit operates in a normal state. When the switch S1 is closed, a normal and usual operation state is maintained. When the switch S1 is opened again, the resistor Rb maintains a high resistance. If the switch S2 is further opened, the resistor Rb changes to a low resistance. Thus the resistor Rb does not have any influence on the circuit 1 and circuit 3.

Next, in order to compare the abnormal operations of the conventional circuit shown in FIG. 13B, the following explanation is given for the case when the switch S1 in FIG. 1B is turned on prior to turning on the switch S2 in the same condition as that of FIG. 13B. In FIG. 1B, first of all, it is assumed that the switch S1 is closed to apply +Vdd to the circuit, while the switch S2 is left open. It is assumed that the resistor Rb has a low resistance before turning on of the switches S1 and S2. When the switch S1 is closed, a current flows as shown by an arrow R, and the current shown by the arrow R flows in the paths as shown by arrows Q and P. The electric potential of the p-type substrate differs depending on the resistances of the resistor Rb and the parasitic resistor R2. The current in the path shown by the arrow Q flows through the resistor Rb, and the current in the path shown by the arrow P flows through the parasitic resistor R2. If the resistance of the resistor Rb is changed, the current in the path shown by the arrow P, flowing from the base to the emitter of the parasitic npn transistor Q3, changes. If the voltage Vbp across the resistor Rb is less than approximately 0.3V, the current shown by the arrow P is very small, and most of the current flows, or bypasses, through the resistor Rb as shown by the arrow Q. Therefore, when the electric potential of the substrate is approximately 0.3V higher than the reference potential Vref, the parasitic npn transistor Q3 has not yet activated and is substantially at the level of the reference potential Vref (closer to the applied minimum electric potential). If the resistance of the resistor Rb is gradually Increased, the current via the path shown by an arrow P gradually and exponentially increases. This is because the path between the base and the emitter of the parasitic npn transistor Q3 has normal silicon diode characteristics. If Vbp is lower than about 0.3V, since the current value of the path shown by an arrow P flowing into the parasitic npn transistor Q3 is small, the occurrence of the latch-up phenomenon becomes extremely rare. But if the voltage Vbp is more than about 0.6 to 0.7V, the current shown by an arrow P proportionally increases. For the reasons mentioned above, in the present invention, the value of the Vbp is maintained low by keeping the resistance of the resistor Rb low, which allows the current flow to bypass through the resistor R2 from the p-type substrate to the reference potential Vref. This reduces the current flowing through the base 20 of the parasitic npn transistor Q3, that is, a current shown by an arrow P. Accordingly, the resistor Rb suppresses the activation of the parasitic elements caused by the latch-up phenomenon or a rise of electric potential of the substrate.

Next, it is assumed that the switch S2 is closed, and the voltage −Vss is supplied to the circuit and normal operation starts. Then, a reverse bias voltage starts increasing between the base and the emitter of the parasitic npn transistor Q3 and the base current in the path shown by the arrow P decreases exponentially. On the other hand, if the switch S2 is closed and the voltage −Vss is applied to the substrate, the resistor Rb electrically detects a voltage −Vss, and the resistance of the resistor Rb increases to a high resistance. Therefore, since the potential of the substrate is lower than the reference potential Vref, if the resistance of the resistor Rb increases, the current shown by the arrow P flowing through the base of the parasitic npn transistor Q3 does not increase.

On the contrary, more reverse bias voltage is applied between the base and emitter of the parasitic npn transistor Q3, latch-up can be prevented from occurring, and the consumption of power in the resistor Rb is decreased. When the switch S2 is opened later and the supply of the voltage −Vss is stopped, the absence of the supply of the voltage −Vss is detected and the resistance of the resistor Rb is electrically lowered. Thereby, the current is bypassed through the resistor Rb, which prevents an increase of the electric potential of the p-type substrate. Accordingly, it is possible to prevent latch-up and the activation of the parasitic elements. Further, when the switch S1 is opened, the resistor Rb maintains its low resistance.

It is possible to provide a semiconductor integrated circuit with a circuit having the same function as disclosed above, in other words a current bypass circuit for detecting the value of the electrical voltage for preventing current from flowing into the path between the reference potential Vref and p-type substrate.

Thereby, it is possible to provide a semiconductor integrated circuit which ensures stable operation without deterioration of or damage to the elements in the semiconductor Integrated circuit if the on-off sequence of the power source is different from the normal sequence. In addition, there is no negative influence on the functions required of the semiconductor integrated circuit due to this addition of the bypass circuit.

Figure 14A:
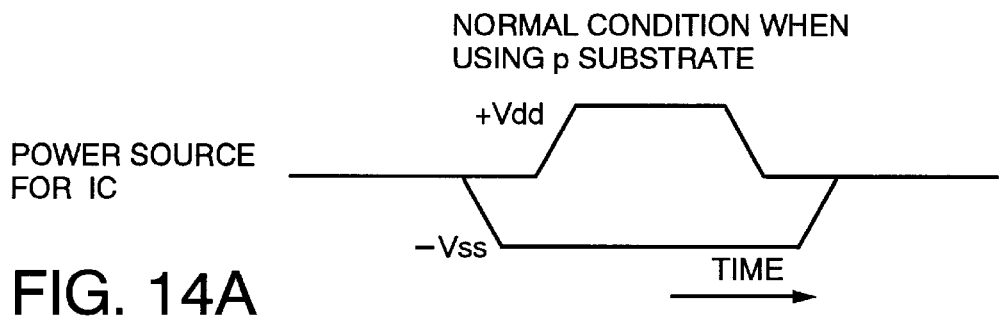
FIG. 14A is a timing chart illustrating the relationship between voltage and time at the normal turning on and turning off of the conventional power source when using a p-type substrate.
Figure 14B:
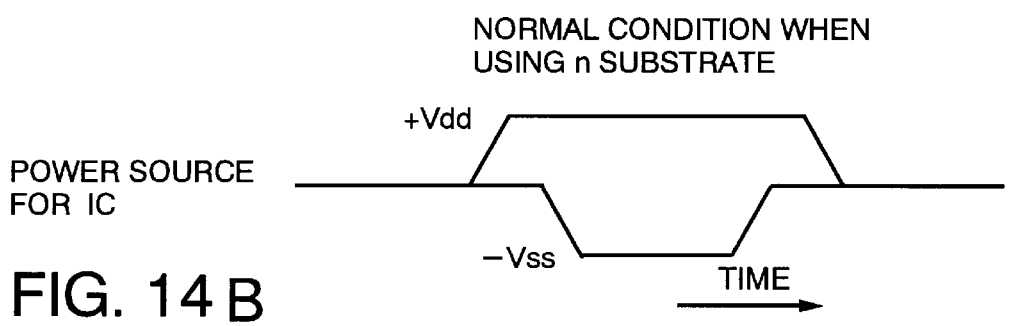
FIG. 14B is a timing chart illustrating the relationship between voltage and time at normal turning on and turning off of the conventional power source when using an n-type substrate.
Figure 15A:
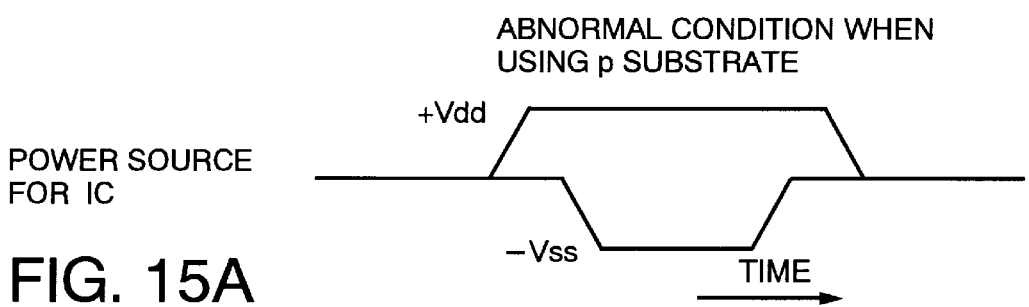
FIG. 15A is a timing chart illustrating the relationship between voltage and time at normal turning on and turning off of the conventional power source when using a p-type substrate.
Figure 15B:
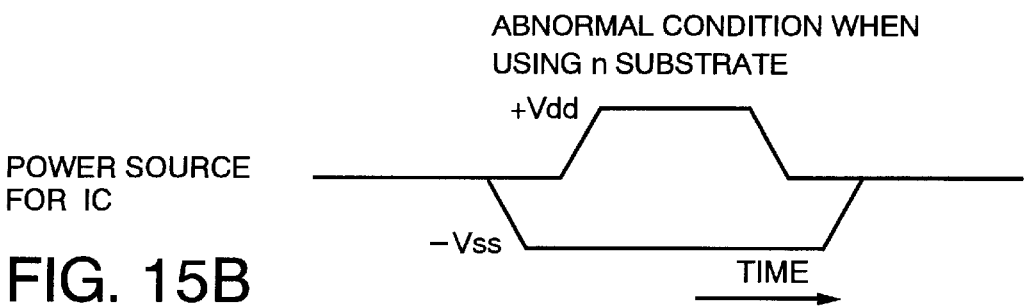
FIG. 15B is a timing chart illustrating the relationship between voltage and time at the normal turning on and turning off of the conventional power source when using an n-type substrate.

On the other hand, in a semiconductor circuit using an n-type substrate, the electric potential of the substrate is set to the highest value of the supply voltage. Therefore, as shown in FIG. 14B, it has been generally preferable to supply voltage from a power source which is higher than the reference potential Vref. In order to prevent abnormal operation, it is possible to suppress the activation of the parasitic circuits in this semiconductor integrated circuit, in the same way as in the semiconductor integrated circuit using the p-type substrate, by integrating a current bypass circuit between the n-type substrate of the highest electric potential and the reference potential Vref. The operation principle above is explained by the change of the resistance of the resistor Rb. Based on this principle, examples of the construction of electric circuits having an equivalent function are explained below.

Figure 2:
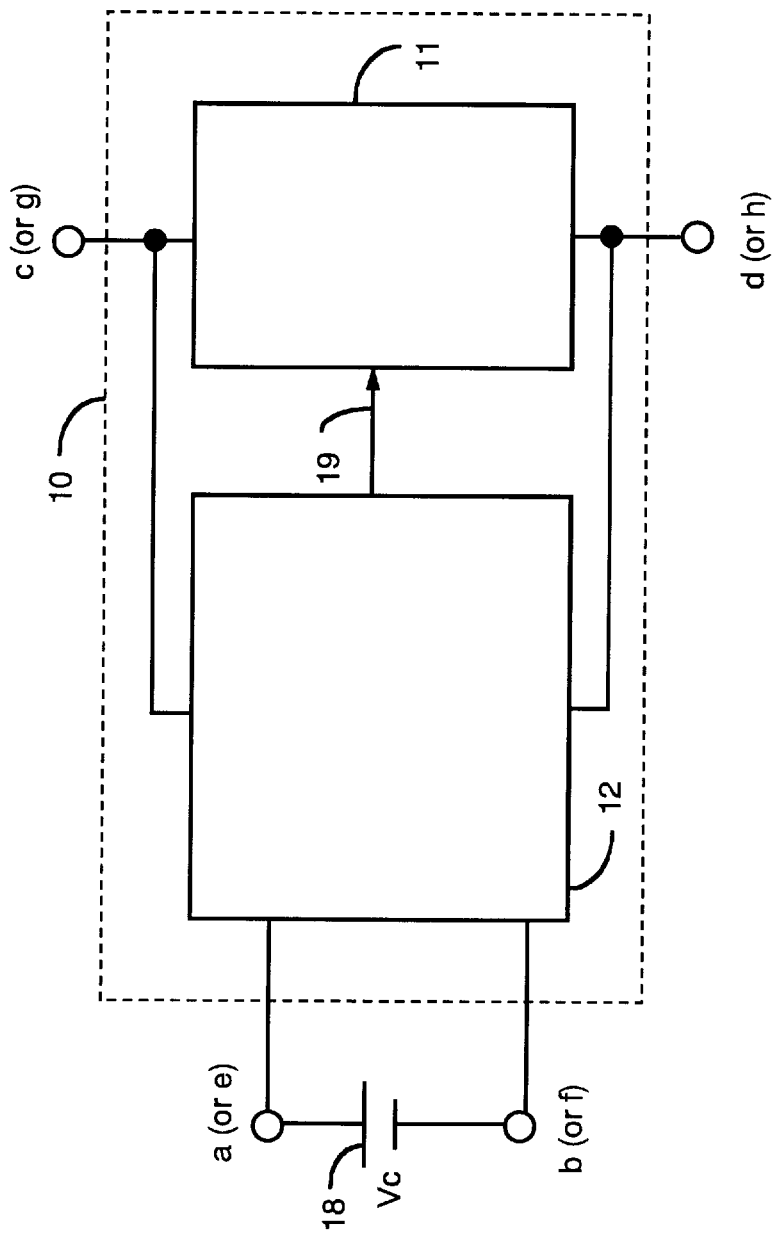
FIG. 2 shows a block diagram of a current bypass circuit.

FIG. 2 shows a block diagram of a current bypass circuit. The current bypass circuit 10 comprises a current switching circuit 11 and a voltage level detecting circuit 12. The current switching circuit 11 can supply a current from a terminal c to a terminal d (or g to h), or from the terminal d to the terminal c (or h to g). However, it is not necessary for current to flow in both directions as above, it is enough for the current to flow from the terminal d to the terminal c (or h to g).

The voltage level detecting circuit 12 controls the flow and the cut-off condition of the current. The voltage level detecting circuit 12 detects the voltage between the terminals c and d (or g and h) and sends a control signal 19 which changes the switching circuit 11 to a conductive state, or to a non-conductive state. If the voltage of the terminal d is positive in comparison with the terminal c (or h is positive in relation to g), the control signal 19 controls the current switching circuit 11 to be in a conductive state. If the voltage of the terminal c is positive in comparison with the terminal d (or g is plus in relation to h), the control signal 19 controls the current switching circuit 11 to be in a non-conductive state.

A control power source 18 is arranged between the terminals a and c or terminals e and f, and its control voltage is ±Vc. The control voltage can be either positive or negative according to the construction of the current bypass circuit. The control voltage is utilized for completely establishing the path between the terminals d and c of the current switching circuit to be conductive before supplying the power source to the semiconductor integrated circuit. The reason for establishing the path as conductive is to prevent the occurrence of the latch-up phenomenon or the activation of the parasitic elements. If a conductive state is not established between the substrate and reference potential Vref before the power is provided to the semiconductor integrated circuit, the current, which could result in the latch-up phenomenon and activation of the parasitic elements, might instantaneously flow into the semiconductor integrated circuit when the power sources are turned on or off for supplying the power to the semiconductor integrated circuit. That is, during a very short time after the power source Is turned on or off and the current bypass circuit detects the value of the voltage of the power source, the current shown by an arrow P might instantaneously flow, which causes the latch-up phenomenon or the parasitic current, which also causes deterioration of or damage to the elements. The terminals c and d of the bypass circuit are connected to the reference potential Vref and the DC voltage power source, respectively, which replaces the bypass circuit in FIG. 2 with the resistor Rb described above.

This current bypass circuit is connected between the power source and the voltage +Vdd or −Vss of the power source, or between the voltages Vdd and Vdd1, or Vss and Vss1 of the power sources. FIGS. 8A–8F, FIGS. 9A–9F, and FIGS. 10A and 10B show typical examples in which the bypass circuits are used.

The current in the current switching circuit 11 saturates during the conductive state, and therefore the current switching circuit 11 does not become a short-circuit. The current switching circuit 11 has a potential difference between the terminal c and d. Therefore, when designing the circuit, the relationship between the saturation current and the potential difference between the terminal c and d (or h and g) becomes important. When integrating a circuit corresponding to the block shown in FIG. 2 into a semiconductor integrated circuit, the control power source 18 receives power from outside of the semiconductor integrated circuit. Therefore, two leads are necessary to supply the voltage from the package to the semiconductor integrated circuit, when designing the current bypass circuit. However, in the current bypass circuit shown in FIGS. 3A–3F and FIGS. 4A–4F, only one additional lead wire is required in each circuit, because other lead is shared by the reference potential Vref, the voltage −Vss or the voltage +Vdd of the power source in the semiconductor integrated circuit.

FIGS. 3A–3D illustrate examples of four kinds of current bypass circuits. In FIGS. 3A–3D, the terminals c and a in the current bypass circuits 10, 40, 1, and 61 are connected. The current bypass circuits 10, 40, 1, and 61 comprise current switching circuits 11, 41, 2, and 62, voltage level detecting circuits 12, 42, 3, and 63, resistors 13 and 43, n channel transistors 14, 15, 4, 64, and 65, p channel transistors 44, 45, 5, 6, and 66, and control power sources 16, 46, 7, and 67 having control voltages of ±Vc, for corresponding circuits. Resistors 17, 47, 8, and 68 may have high resistances such that their power consumption can be ignored.

Figure 3A:
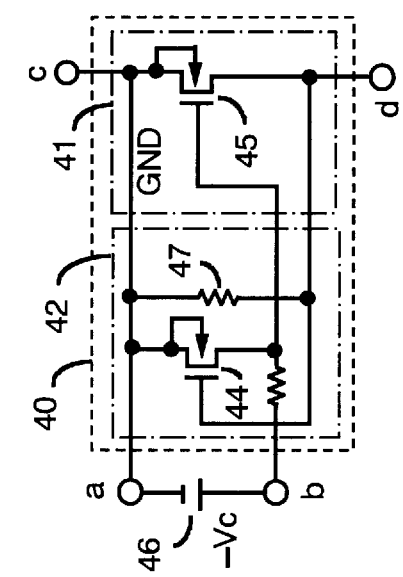
FIGS. 3A–3D respectively show examples of the bypass circuit.
Figure 3B:
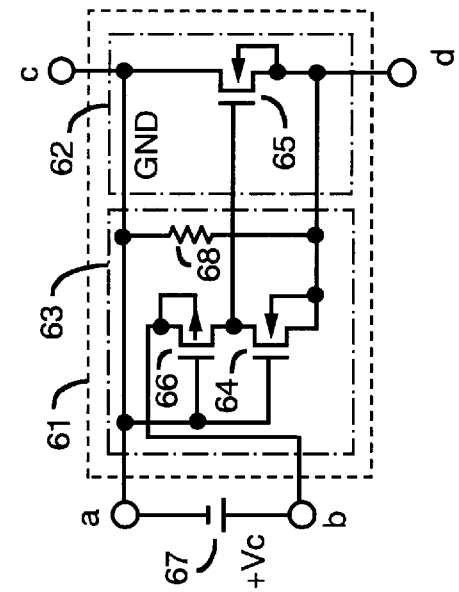

The current bypass circuits in FIG. 3A comprise n channel transistors 14 and is, while the current bypass circuits in FIG. 3B comprise p channel transistors 44 and 45. The direction of the voltage of the control power supply 46 in FIG. 3B is reversed from the control voltage 16 in FIG. 3A, but their functions are the same. In the current bypass circuits 1 and 61 of FIGS. 3C and 3D, the resistors 43 and 13 in the respective FIGS. 3B and 3A are replaced by n channel transistor 4 and p channel transistor 66, respectively.

Figure 3C:
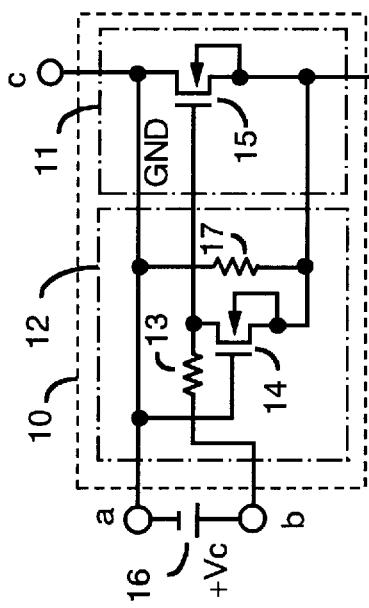
Figure 3D:
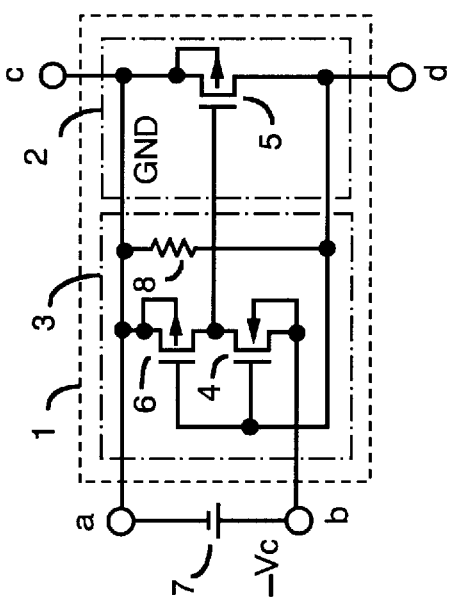

In FIGS. 3B and 3A, when the paths between the drain and the source of the p channel transistor 44 and n channel transistor 14 are conductive, the resistors 43 and 13 consume power, but in FIGS. 3C and 3D, the n channel transistor 4 and p channel transistor 66 in respective current bypass circuits 1 and 61 do not consume power. Therefore the current bypass circuits 1 and 61 of FIGS. 3C and 3D have an advantage over the current bypass circuits 40 and 10 of FIGS. 3B and 3A. Although the threshold values, when the current is switched from the conductive state to the cut-off state via the terminals c and d, are different in FIG. 3C and in FIG. 3D, their functions are the same.

The current bypass circuits 10, 40, 1, and 61 have to have high resistances connected between the terminals c and d such as resistors 17, 47, 8, and 68. semiconductor integrated circuit, when designing the current bypass circuit. However, in the current bypass circuit shown in FIGS. 3A–3F and FIGS. 4A–4F, only one additional lead wire is required in each circuit, because other lead is shared by the reference potential Vref, the voltage −Vss or the voltage +Vdd of the power source in the semiconductor integrated circuit.

FIGS. 3A–3D illustrate examples of four kinds of current bypass circuits. In FIGS. 3A–3D, the terminals c and a in the current bypass circuits 10, 40, 1, and 61 are connected. The current bypass circuits 10, 40, 1, and 61 comprise current switching circuits 11, 41, 2, and 62, voltage level detecting circuits 12, 42, 3, and 63, resistors 13 and 43, n channel transistors 14, 15, 4, 64, and 65, p channel transistors 44, 45, 5, 6, and 66, and control power sources 16, 46, 7, and 67 having control voltages of ±Vc, for corresponding circuits. Resistors 17, 47, 8, and 68 may have high resistances such that their power consumption can be ignored.

The current bypass circuits in FIG. 3A comprise n channel transistors 14 and 15, while the current bypass circuits in FIG. 3B comprise p channel transistors 44 and 45. The direction of the voltage of the control power supply 46 in FIG. 3B is reversed from the control voltage 16 in FIG. 3A, but their functions are the same. In the current bypass circuits 1 and 61 of FIGS. 3C and 3D, the resistors 43 and 13 in the respective FIGS. 3B and 3A are replaced by n channel transistor 4 and p channel transistor 66, respectively.

In FIGS. 3B and 3A, when the paths between the drain and the source of the p channel transistor 44 and n channel transistor 14 are conductive, the resistors 43 and 13 consume power, but in FIGS. 3C and 3D, the n channel transistor 4 and p channel transistor 66 in respective current bypass circuits 1 and 61 do not consume power. Therefore the current bypass circuits 1 and 61 of FIGS. 3C and 3D have an advantage over the current bypass circuits 40 and 10 of FIGS. 3B and 3A. Although the threshold values, when the current is switched from the conductive state to the cut-off state via the terminals c and d, are different in FIG. 3C and in FIG. 3D, their functions are the same.

The current bypass circuits 10, 40, 1, and 61 have to have high resistances connected between the terminals c and d such as resistors 17, 47, 8, and 68. These resistors 17, 47, 8, and 68 may be included inside or outside of the semiconductor integrated circuit connected between the terminals c and d. It is preferable not to integrate a resistor with a high resistance into a semiconductor integrated circuit, because a resistor with high resistance needs a large area. If the resistors are integrated into the semiconductor integrated circuit, the gates of the respective transistors included in the respective current bypass circuits 10, 40, 1, and 61 may be floating at the time of cut-off of the voltages −Vss or +Vdd, and, therefore, the electric potential of the gates could be indefinite. It is preferable that resistors 17, 47, 8, and 68 be located outside of the semiconductor integrated circuit.

Since these circuits are provided with the control voltage ±Vc from the control power sources 16, 46, 7, and 67, the respective switching circuits 11, 41, 2, and 62 are conductive prior to the application of the DC voltage to the semiconductor integrated circuit. When the terminal d has a higher positive voltage in comparison with the terminal c, in other words when current is flowing from the terminal d to the terminal c, the respective switching circuits 11, 41, 2, and 62 are also conductive. If the electric potential of the terminal c becomes negative in comparison with the terminal d, the path between the drain and the source of the transistors 14, 44, 6, and 66 becomes conductive, the transistors 4 and 64 become non-conductive, and the paths between the terminals c and d of the respective current switching circuits enter cut-off.

FIGS. 4A–4D illustrate examples of four other kinds of current bypass circuits. In FIGS. 4A–4D, the terminals f and h in current bypass circuits 1, 51, 31, and 71 are connected. The current bypass circuits 1, 51, 31, and 71 comprise current switching circuits 22, 52, 32, and 72, voltage level detecting circuits 23, 53, 33, and 73, resistors 26 and 56, p channel transistors 24, 25, 35, 75, and 76, n channel transistors 54, 55, 34, 36, and 74, and control power sources 27, 57, 37, and 77 having a control voltage ±Vc. Resistors 28, 58, 38, and 78 may have high resistances such that their power consumption can be ignored.

Figure 4B:
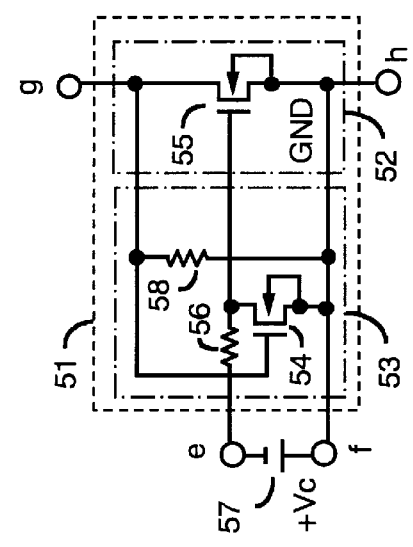
FIGS. 4A–4D respectively show examples of the bypass circuit.
Figure 4D:
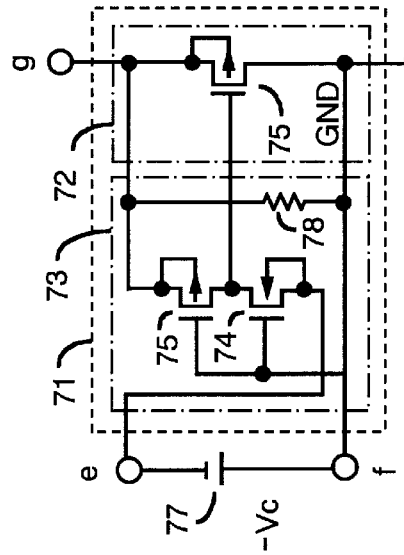
Figure 4A:
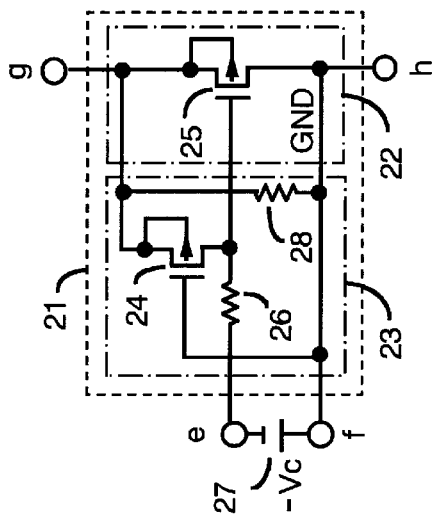

The current bypass circuit in FIG. 4A comprises p channel transistors 24 and 25, while the current bypass circuits in FIG. 4B comprises n channel transistors 54 and 55. The direction of the voltage of control power supply 57 in FIG. 3B is reversed from the control voltage 26 in FIG. 4A, but their functions are the same. In the current bypass circuits 31 and 71 of FIGS. 4C and 4D, the resistors 56 and 26 in the respective FIGS. 4B and 4A are replaced by p channel transistor 35 and n channel transistor 78, respectively.

Figure 4C:
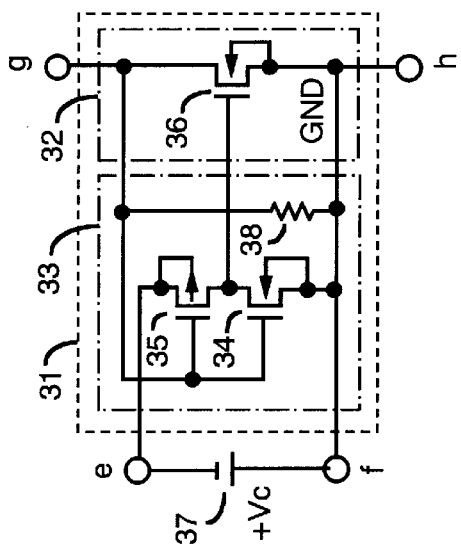

In FIGS. 4B and 4A, when the paths between the drain and the source of the n channel transistor 54 and p channel transistor 24 are conductive, the resistors 56 and 26 consume power, but in FIGS. 4C and 4D, the p channel transistor 35 and n channel transistor 74 in respective current bypass circuits 31 and 71 of the FIGS. 4C and 4D do not consume power. Therefore the current bypass circuits 31 and 71 of the FIGS. 4C and 4D have an advantage over the current bypass circuits 51 and 21 of the FIGS. 4B and 4A. In addition, although the threshold, when the current is switched from the conductive state to the cut-off state via the terminals g and h, is different in FIG. 4C and in FIG. 4D, the operation of FIG. 4C and FIG. 4D is the same.

The current bypass circuits 21, 51, 31, and 71 have to have high resistances connected between the terminals c and d such as resistors 28, 58, 38, and 78. These resistors 28, 58, 38, and 78 may be included inside or outside of the semiconductor integrated circuit connected between the terminals g and h. It is preferable not to integrate a resistor with a high resistance into the semiconductor integrated circuit, because a resistor with a high resistance needs much space. If resistors are integrated in the semiconductor integrated circuit, the gates of the respective transistors included in the respective current bypass circuits 21, 51, 31, and 71 may be floating at the time of cut-off of the voltages −Vss or +Vdd, and therefore the electric potential of the gates could be indefinite. It is preferable that resistors 28, 58, 38, and 78 be located outside of the semiconductor integrated circuit.

Since these circuits are provided with the control voltage ±Vc from the control power sources 27, 57, 37, and 77, the respective switching circuits 22, 52, 32, and 72 are conductive prior to the application of the DC voltage to the semiconductor integrated circuit. When the terminal h has a higher positive voltage than the terminal g, in other words when current is flowing from the terminal h to the terminal g, the respective switching circuits 22, 52, 32, and 62 are also conductive. If the electric potential of the terminal g is negative in comparison with the terminal h, the path between the drain and the source of the transistors 24, 54, 35, and 75 becomes conductive, the transistors 34 and 74 becomes nonconductive, and the paths between the terminals g and h of the respective current switching circuits enter cut-off.

Embodiment 1

Figure 5B:
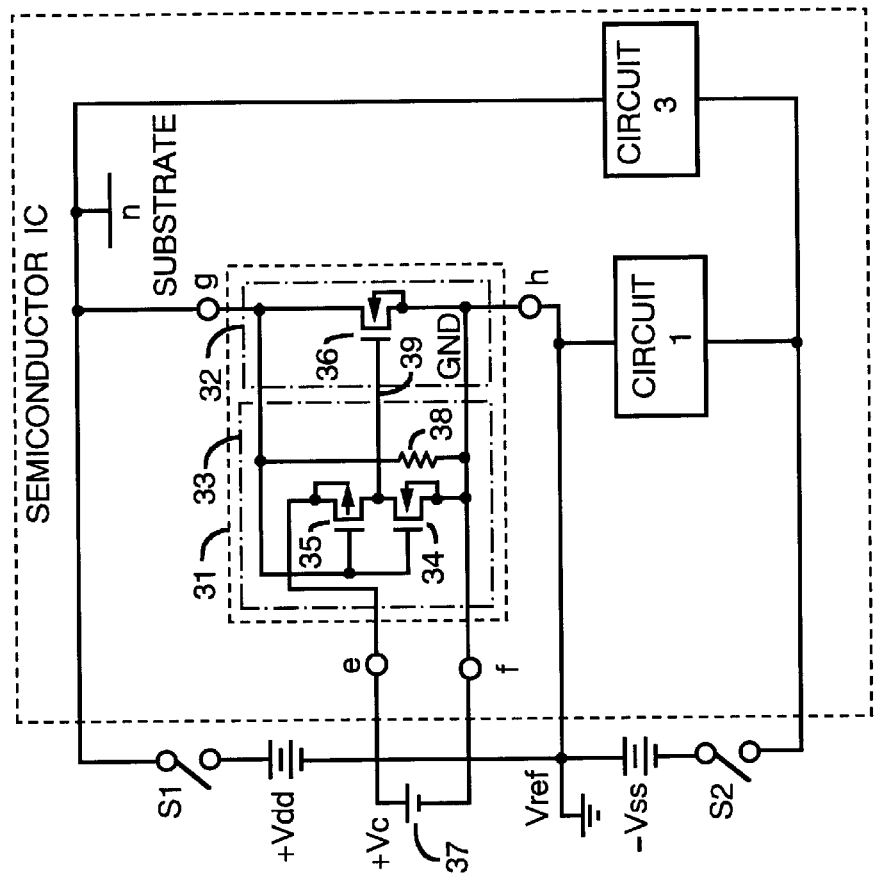
FIGS 5A and 5B show semiconductor integrated circuits with a current bypass circuit according to first and second embodiments.
Figure 5A:
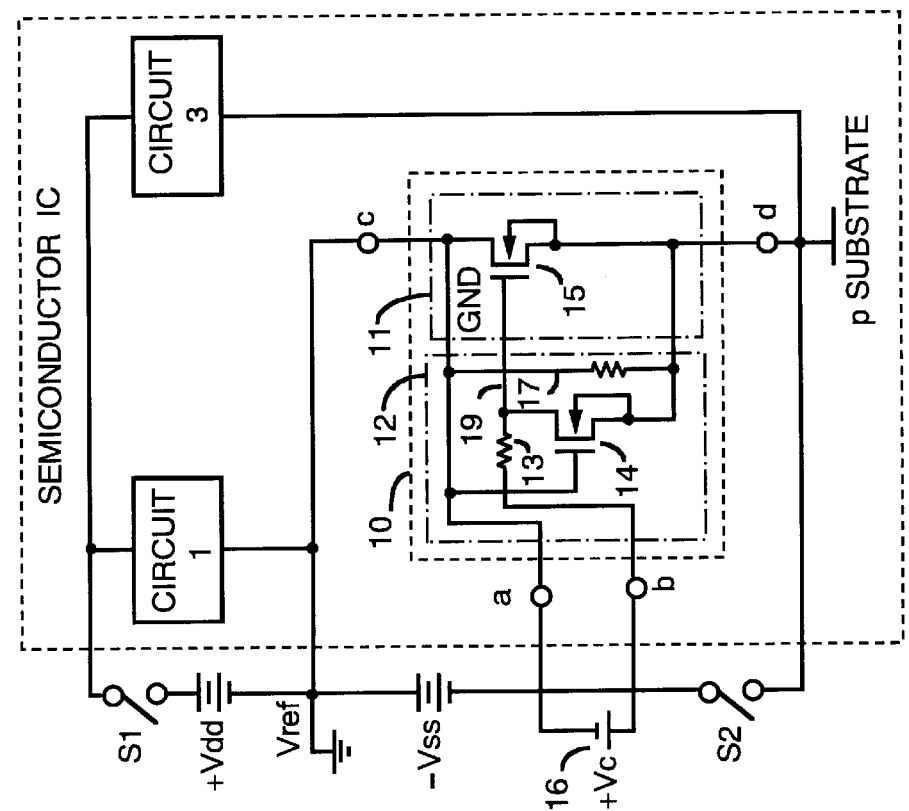

FIG. 5A illustrates the current bypass circuit 10 of FIG. 3A integrated on a p-type substrate in the semiconductor integrated circuit. As shown in FIG. 5A, the terminal c is connected to the reference potential Vref, and the terminal d is connected to the power source voltage −Vss. In the respective circuits shown in FIGS. 3A and 3B, the terminals c and a are on the same wire. Moreover, since the terminal c is connected to the reference potential Vref, the control voltage ±Vc between the terminals a and b is determined in relation to the reference potential Vref. The control voltage ±Vc of the respective circuits of FIGS. 3A–3F can be set to a voltage in relation to the reference potential Vref of the semiconductor integrated circuit.

In FIG. 5A, the semiconductor integrated circuit comprises a CMOS circuit 1 and a bipolar circuit 3. In FIG. 5A, the switches S1 and S2 are opened, and the control voltage +Vc of the control power source 16 is assumed to be supplied between the terminals a and b before turning on of the switches S1 and S2. Thus, the n channel transistor 14 is in cut-off, and the n channel transistor 15 is conductive That is, the path between the terminals c and d of the current bypass circuit 10 is conductive.

Figure 6A:
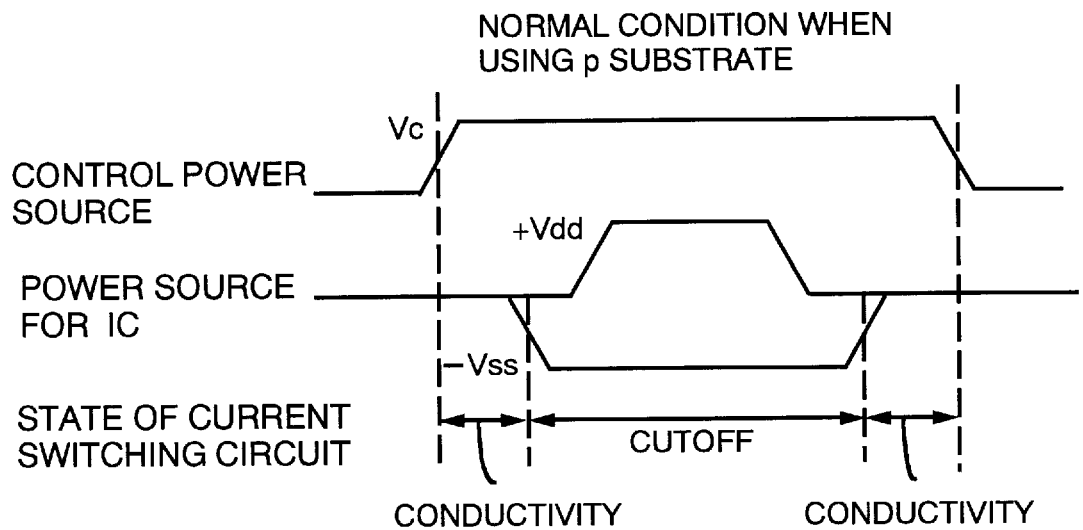
FIG. 6A is a timing chart illustrating the relationship between voltage and time at the normal turning-on and turning-off of the power source, when using a p-type substrate.

The normal sequence for turning on of the power source is explained using FIG. 5A. The normal turn-on sequence occurs when the switch S2 is turned on prior to the turn on of the switch S1. It is assumed that the switch S1 is left open, and the switch S2 is closed to apply the voltage −Vss to the circuit. When the switch S2 is closed and the voltage −Vss is applied to the terminal d, the voltage level detecting circuit 12 in the current bypass circuit 10 detects that the electric potential of the terminal d is lower than that of terminal c, and the control signal 19 sets the current switching circuit 11 to cut-off. In other words, since the gate of the n channel transistor 14 receives a positive voltage compared to the source, the path between the drain and the source becomes conductive. Therefore, since the gate voltage of the n channel transistor 15 in the current switching circuit 11 decreases compared to its source voltage, the path between the drain and the source, in other words, the path between the terminals c and d, changes to the cut-off state. The p-type substrate shifts to the electric potential −Vss, and, since the reverse bias voltage is applied to the parasitic circuit in the circuits 1 and 3, the parasitic elements do not operate. However, since current flows into the resistor 13, electrical power is consumed. Next, the switch S1 is turned on and the semiconductor integrated circuit starts its operation. However, the electric potential of the p-type substrate is at the minimum state. Even when the switch S1 is opened again, the electric potential Is still at the minimum state. After that, the switch S2 is opened, that is, both the switches S1 and S2 are opened, so the path between the terminal c and d shifts to the conductive state. Therefore, in neither case do the parasitic circuits operate, and the current bypass circuits have no effect on the circuits 1 and 3. FIG. 6A is a timing chart of a normal turn on of the power sources.

Next, an abnormal sequence for turning on the power source is explained using FIG. 5A. The abnormal turn on sequence occurs when the switch S1 is turned on before the switch S2. First, the switch S1 is closed and the switch S2 is kept open, then the voltage +Vdd is applied to the semiconductor integrated circuit. When the switch S1 is closed, since the path between the terminals c and d is already in the conductive state, the electric potential of the p-type substrate is substantially at the reference potential Vref. That is, the p-type substrate is at a substantially minimum electric potential. In other words, the electric potential of the p-type substrate is higher than the applied minimum electric potential by the amount of the difference of the electric potential between the terminals c and d, that is, by a switching voltage. It is preferable that this electric potential difference be less than approximately 0.3V because, if the electric potential at point d increases to approximately 0.3V in comparison with the reference potential Vref, this 0.3V does not normally activate the parasitic circuits. Therefore, it is important to design the n channel transistor 15 so that the electric potential of the n channel transistor 15 does not increase more than approximately 0.3V. For the design standard of the transistor used in the n channel transistor 15 In the current switching circuit 11, it is preferable to know the relation between the source-drain current characteristics and the circuit current in relation to the transistor size, and to refer to and use it when designing the semiconductor integrated circuit.

Figure 6B:
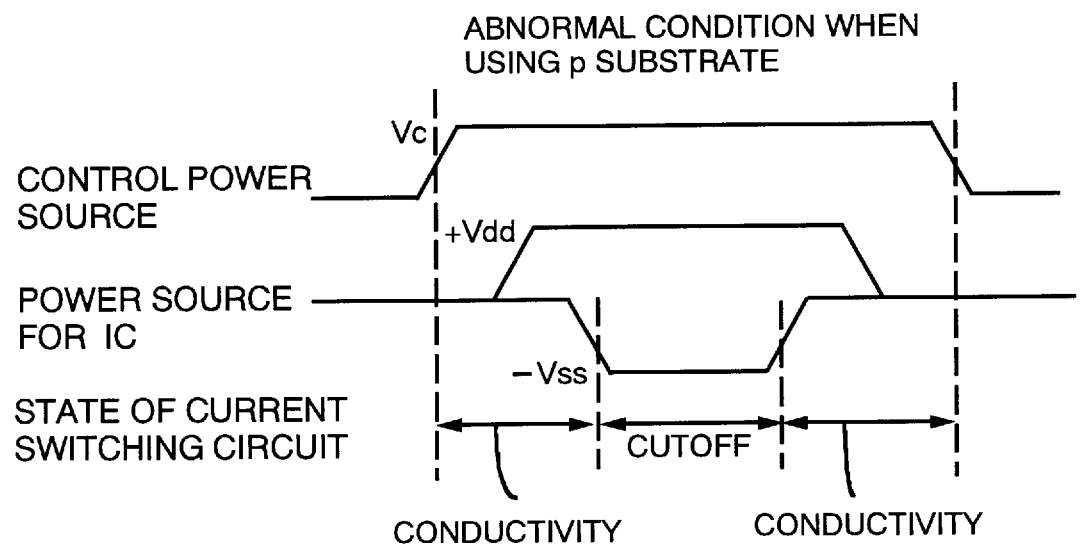
FIG. 6B is a timing chart illustrating the relationship between voltage and time at abnormal turning on and turning off of the power source, when using a p-type substrate.

If the switch S2 is closed after the switch S1 is closed, the voltage −Vss is applied to the semiconductor integrated circuit, When the electric potential of the terminal d becomes negative in comparison with that of terminal c, the n channel transistor 14 in the voltage level detector 12 becomes conductive. Since the gate voltage of the n channel transistor 15 in the current switching circuit 11 decreases, the path between the terminals c and d enters cut-off. The electric potential of the p-type substrate decreases to the voltage −Vss, and the operation of the parasitic circuit is suppressed. When the switch S2 is opened again, the path between the terminals c and d becomes conductive. If the electric potential of the substrate increases to below approximately 0.3V in comparison with the reference potential Vref, it is possible to suppress the operation of the parasitic circuit. Further, after the switch S1 is opened, the path between the terminals c and d becomes conductive, and the electric potential of the substrate becomes equal to the reference potential Vref. In this manner, it is possible to suppress the activation of the parasitic circuits without Influencing the circuits 1 and 3. FIG. 6B is a timing chart of an abnormal turn-on sequence of the power sources, As described for the first embodiment, by integrating the current bypass circuit in the semiconductor integrated circuit, it Is possible to maintain the electric potential of the substrate at a potential sufficient to suppress the activation of the parasitic circuits. Therefore, it is possible to supply power to the semiconductor integrated circuit without considering the on-off sequence of the power sources. This is especially true since the current switching circuit in the current bypass circuit is maintained in a conductive state, by the control power source, prior to the turning on of the power sources used for the semiconductor integrated circuits. Therefore, since the latch-up phenomenon does not occur and parasitic currents do not flow, even when abnormal turning on of the DC voltage power source occurs, stable operation is possible. Also, when abnormal cut-off of the DC voltage power source occurs, stable operation is possible.

Embodiment 2

FIG. 5B illustrates the current bypass circuit 31 of FIG. 4C integrated on the p-type substrate in the semiconductor integrated circuit. As shown in FIG. 5B, the terminal h is connected to the reference potential Vref, and the terminal 9 is connected to the power source voltage +Vdd. In the respective circuits shown in FIG. 4, terminals h and f are on the same wire. Moreover, since the terminal h is connected to the reference power potential Vref, the control voltage ±Vc between the terminals c and f is determined in relation to the reference potential Vref. The control voltage ±Vc of the respective circuit in FIG. 4 can be set to a voltage relative to the reference potential Vref of the semiconductor integrated circuit.

In FIG. 5B, the semiconductor integrated circuit comprises a CMOS circuit 1 and a bipolar circuit 3. The switches S1 and S2 are opened, and the control voltage +Vc of the control power source 37 is assumed to be supplied between the terminals e and f before turning on of the switches S1 and S2. Therefore, n channel transistor 36 and the p channel transistor 35 are conductive, and the n channel transistor 34 is in cut-off. That is, the path between the terminals g and h of the current bypass circuit 31 is conductive.

The normal sequence for turning on of the power source is explained using FIG. 5B. The normal turn-on sequence occurs when the switch S1 is turned on prior to the turn on of the switch S2. It is assumed that the switch S2 is left open, and the switch S1 is closed to apply the voltage −Vdd to the circuit. When the switch S1 is closed and voltage +Vdd is applied to the terminal g, the voltage level detecting circuit 33 in the current bypass circuit 31 detects that the electric potential of the terminal h is low in comparison with that of terminal g, and the control signal 39 sets the current switching circuit 32 to cut-off. That is, the gate of the n channel transistor receives a positive voltage in comparison with the source, the path between the drain and the source of the n channel transistor 34 becomes conductive. Therefore, the path between the source and the gate of the p channel transistor 35 decreases to approximately 0V, and thus the path between the source and drain enters cut-off. Therefore, the gate voltage of the n channel transistor of the current switching circuit 32 as a control signal 39 decreases in comparison with the source, and the path between the drain and the source, that is, between the terminals g and h, Is in cut-off. Since the electric potential of the n-type substrate becomes +Vdd, which is a reverse voltage for the parasitic circuits integrated in the circuits 1 and 3, the parasitic circuits do not operate.

Figure 7A:
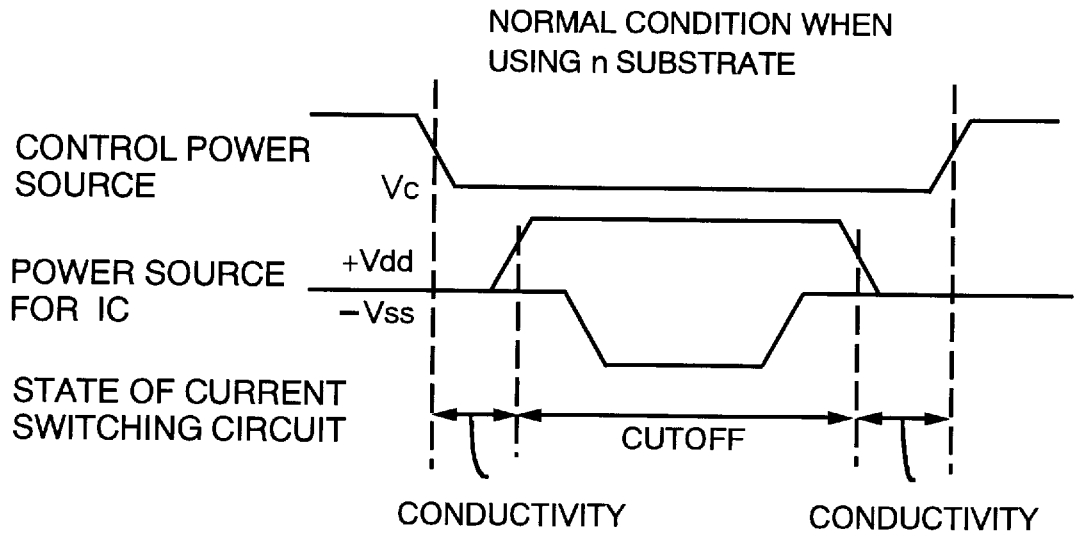
FIG. 7A is a timing chart illustrating the relationship between voltage and time at normal turning on and turning off of the power source when using an n-type substrate.

Next, the switch S2 is turned on and the semiconductor integrated circuit starts its operation, However, the electric potential of the p-type substrate is at the maximum state. Even when the switch S2 is opened again, the electric potential of the substrate remains at its maximum state. Then, the switch S1 is opened, that is, both the switches S1 and S2 are opened, and the path between the terminals g and h shifts to a conductive state. Therefore, in neither case do the parasitic circuits operate, and current bypass circuits do not affect the circuits 1 or 3. FIG. 7A is a timing chart for the normal turn-on sequence of the power sources.

Next, an abnormal sequence for turning on the power source is explained using FIG. 5B. The abnormal turn-on sequence occurs when the switch S2 is turned on before the switch S1. First, the switch S2 is closed, and the switch S1 is kept open, then the voltage −Vss is applied to the semiconductor integrated circuit. When the switch S2 is closed, since the path between the terminals g and h is already conductive, the electric potential of the n-type substrate is substantially the reference potential Vref. That is, the electric potential of the n-type substrate is at its maximum electric potential. In other words, the electric potential of the n-type substrate is lower than the maximum input electric potential by the electric potential difference between the terminals h and g, that is, by the switching voltage. It is preferable that this electric potential difference be less than approximately 0.3V. If the electric potential at the point g decreases to approximately 0.3V in comparison with the reference potential Vref, this 0.3V does not normally activate the parasitic circuits. Therefore, it is important to design the n channel transistor 36 so that the electric potential of the n channel transistor 36 does not rise more than approximately 0.3V. For the design standard of the transistor used in the n channel transistor 36 in the current switching circuit 32, it is preferable to know the relation between the source-drain current characteristics and the circuit current in relation to the transistor size, and to refer to and use it when designing the semiconductor integrated circuit.

Figure 7B:
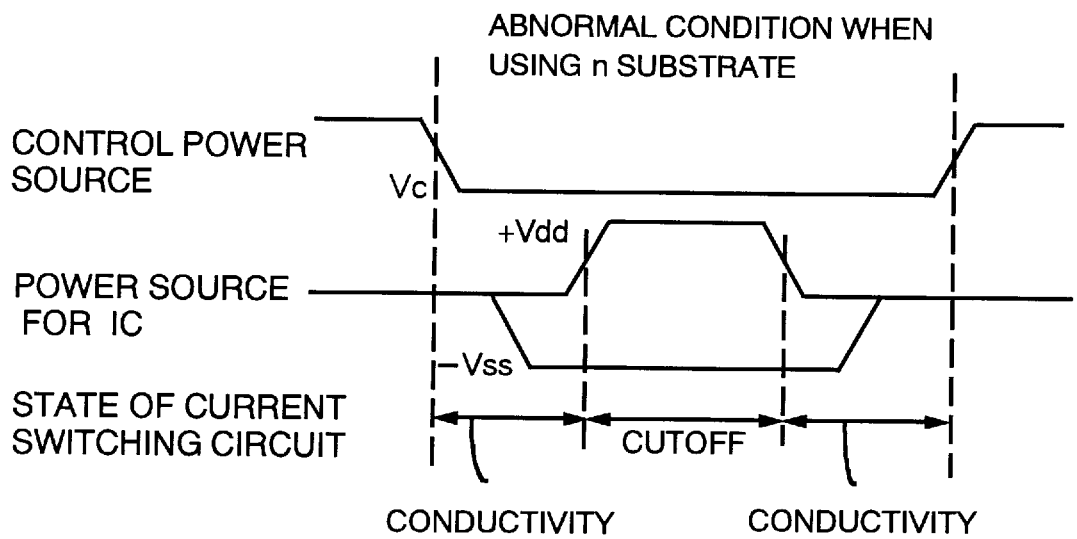
FIG. 7B is a timing chart illustrating the relationship between voltage and time at abnormal turning on and turning off of the power source when using an n-type substrate.
Figure 9A:
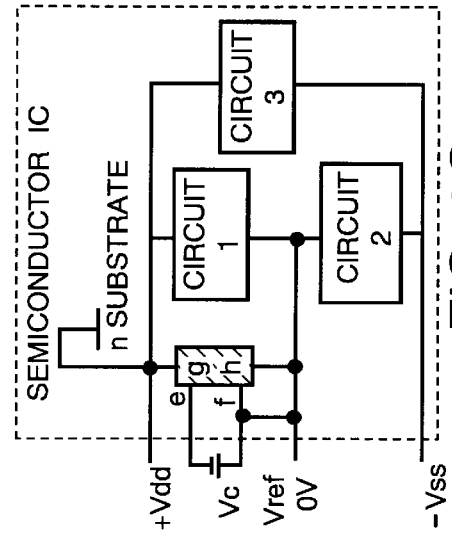
FIGS. 9A–9F show other respective semiconductor integrated circuits with the current bypass circuit according to the third embodiment of the present invention.
Figure 9B:
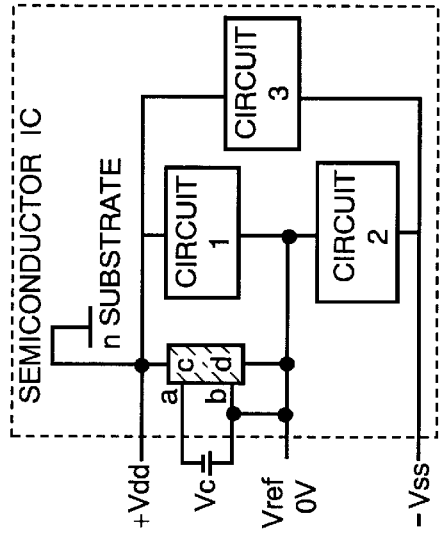
Figure 9C:
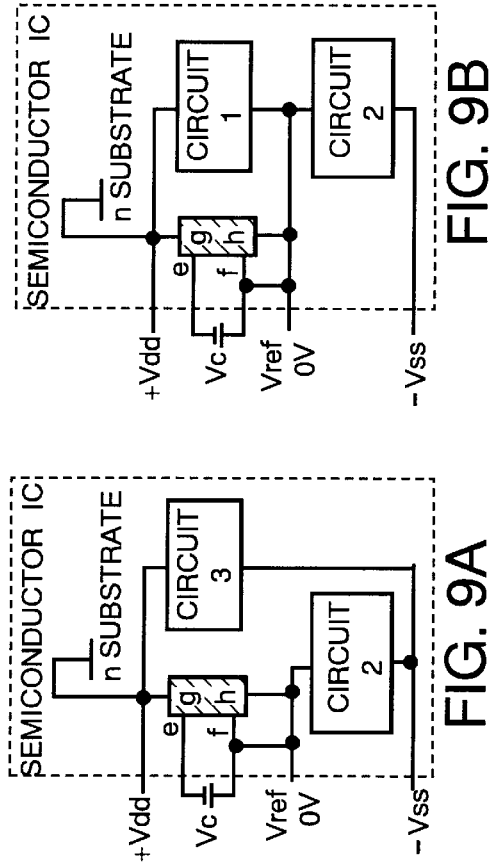
Figure 9D:
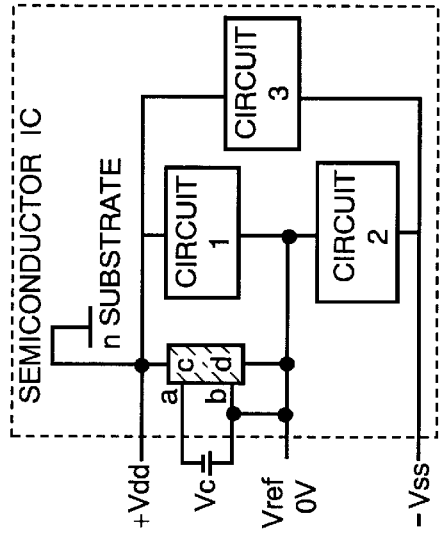
Figure 9E:
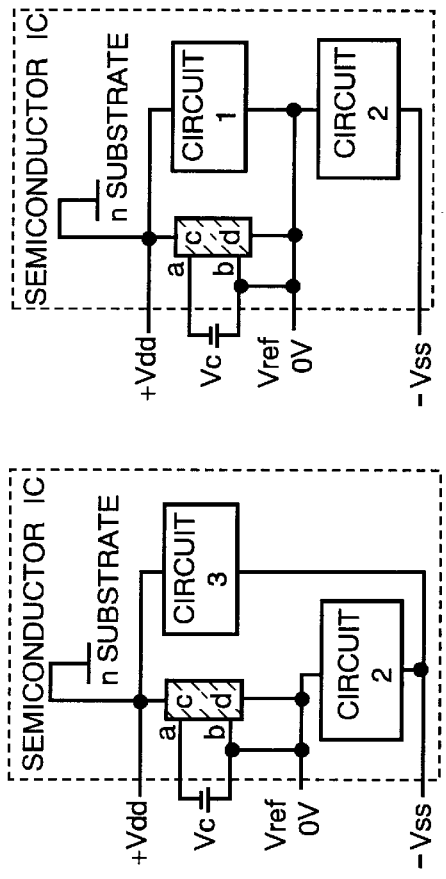
Figure 9F:
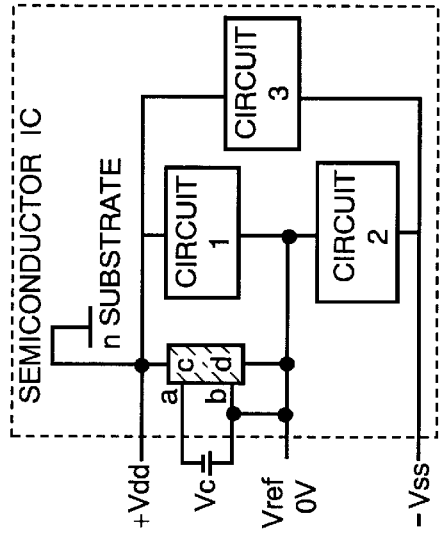
Figure 12:
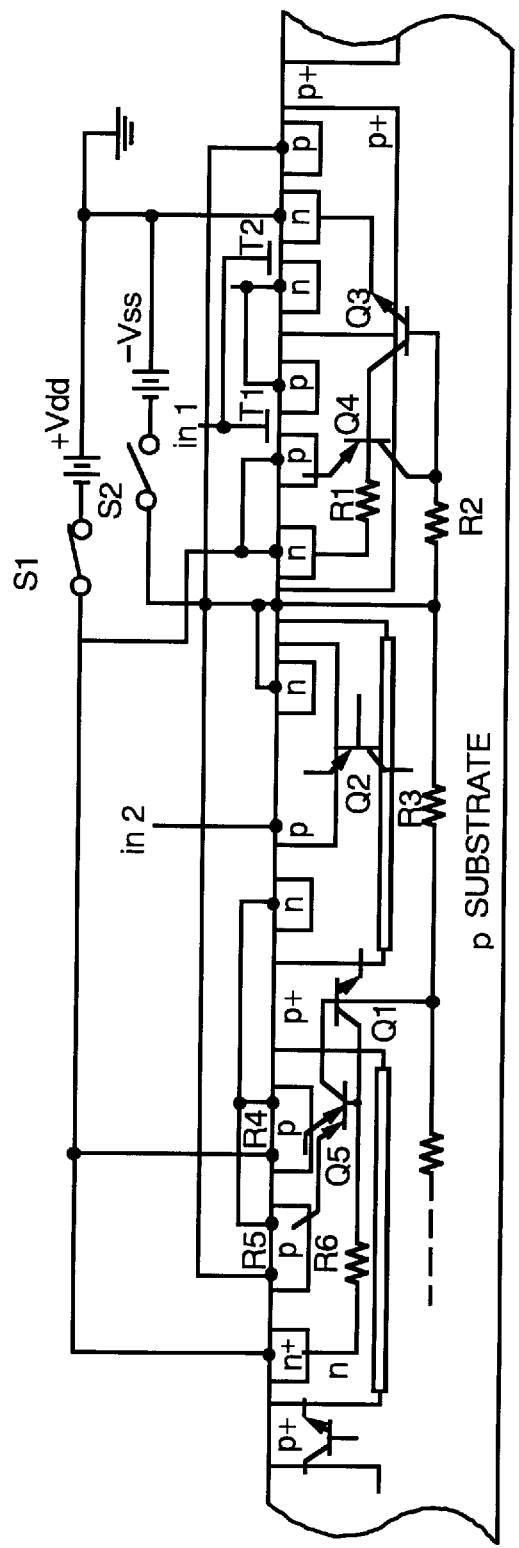
FIG. 12 explains construction of a conventional BI-CMOS integrated circuit.

As explained above, if the switch S1 is closed after the switch S2 is closed, the voltage +Vdd is applied to the semiconductor integrated circuit. When the electric potential of the terminal h becomes negative in comparison with the electric potential of the terminal g, the n channel transistor 34 in the voltage level detector 33 becomes conductive, and then the p channel transistor 35 shifts to a cut-off state. Thus the gate voltage of the n channel transistor 36 in the current switching circuit, as a control signal 39, decreases, and the path between the terminals h and g changes to a cut-off state. The electric potential of the p-type substrate increases to a voltage +Vdd, and the operation of the parasitic circuit is suppressed. When the switch S1 is opened again, the path between the terminals g and h becomes conductive. When the electric potential of the substrate decreases to approximately 0.3V in comparison with the reference potential Vref, it is possible to suppress the activation of the parasitic circuits. Further, after the switch S2 is opened, that is, both the switches S1 and S2 are open, the path between the terminals h and g is conductive and the electric potential of the substrate is substantially equal to the reference potential Vref. In this manner, it is possible to suppress the activation of the parasitic circuits without influencing the circuits 1 and 3. FIG. 7B is a timing chart of a case of abnormal turn on of the power sources.

As described for the second embodiment, by integrating the current bypass circuit in the semiconductor integrated circuit, it is possible to maintain the electric potential of the substrate at a potential sufficient to suppress the activation of the parasitic circuits. Therefore, it is possible to supply power to the semiconductor integrated circuit without considering the on-off sequence of the power sources. This is especially true since the current switching circuit in the current bypass circuit is maintained in a conductive state by the control power source, prior to the turning on of the power sources used for the semiconductor integrated circuits. Therefore, since the latch-up phenomenon does not occur and parasitic currents do not flow, even if abnormal turning on of the DC voltage power source occurs, stable operation is possible. Also, when abnormal cut-off of the DC voltage power source occurs, stable operation is possible.

Embodiment 3

The foregoing examples include two positive and negative power sources in relation to the reference potential Vref and two circuits. However, the present invention is not limited to these examples. It can also be applied to a plurality of power sources and a plurality of circuits. FIGS. 8A–8F show current bypass circuits applied to semiconductor integrated circuits having a plurality of circuits using a p-type substrate and two power sources. FIGS. 9A–9F show current bypass circuits applied to semiconductor integrated circuits having a plurality of circuits using an n-type substrate and two power sources, FIGS. 10A and 10B show current bypass circuits applied to a plurality of circuits (six circuits) using p-type and n-type substrates in a semiconductor integrated circuit and a plurality of power sources (four power sources). However, a plurality of current bypass circuits needs to be integrated into the semiconductor integrated circuits. Therefore, in FIGS. 10A and 10B, because two current bypass circuits are connected in series, the voltage drop value of the circuits must be carefully considered. Any kind of circuit constructions or systems may be used as the circuits 1, 2, 3, 4, 5, and 6 shown in FIGS. 8A–8F, FIGS. 9A–9F and FIGS. 10A and 10B. The current bypass circuits may be also applied to a semiconductor integrated circuit produced by isolation using a pn junction.

As explained above, in integrating a current bypass circuit into a semiconductor integrated circuit having a plurality of power sources and a plurality of circuits, the invention has an advantage in that the semiconductor integrated circuit can be easily realized without considering the on-off sequence of the power sources.

What is claimed is:

1. A current bypass circuit used in a semiconductor integrated circuit supplied with power from a plurality of power sources having a plurality of different DC voltages in relation to a reference potential, said integrated circuit including a doped semiconductor substrate, said semiconductor integrated circuit being connected to the reference potential, said bypass circuit comprising:

a current switching circuit connected between the reference potential and said plurality of power sources for producing one of a conductive state and a cutoff state therebetween;

a voltage level detecting circuit connected to a control power source for maintaining said current switching circuit in a conductive state when a voltage appearing across said current switching circuit does not exceed a predetermined value, and for cutting-off said current switching circuit when the voltage across the terminals of said current switching circuit exceeds the predetermined value.

2. The current bypass circuit used in a semiconductor integrated circuit according to claim 1 wherein the predetermined value is a voltage determined by a circuit configuration of said voltage level detecting circuit and by an electrical characteristic of an active element in said current bypass circuit.

3. A current bypass circuit used in a semiconductor integrated circuit supplied with power from a plurality of power sources having a plurality of different DC voltages in relation to a reference potential, said integrated circuit including a doped semiconductor substrate, said semiconductor integrated circuit being connected to the reference potential, said bypass circuit comprising:

a current switching circuit connected between the reference potential and the plurality of power sources for producing at least one of a conductive state and a cutoff state therebetween the current switching circuit including a plurality of active elements;

a voltage level detecting circuit connected to a control power source for maintaining said current switching circuit in a conductive state when a voltage appearing across said current switching circuit does not exceed a switching voltage of the active elements, and for cutting off said current switching circuit when the voltage across terminals of said current switching circuit exceeds the switching voltage of the active elements.

4. The current bypass circuit used in a semiconductor integrated circuit according to claim 3 comprising a control circuit for controlling an electric potential of said semiconductor substrate, when said substrate is p type, not to exceed a voltage drop of said current switching circuit when said current switching circuit is conducting and for controlling the electric potential of said semiconductor substrate when said semiconductor substrate is n type, not to be lower than the voltage drop of said current switching circuit when said current switching circuit is conducting, in a transitional state of turning-on or turning-off a DC voltage provided from one of said plurality of power sources.

5. The current bypass circuit used in a semiconductor integrated circuit according to claim 3 wherein said voltage level detecting circuit comprises a control signal generating circuit for generating a control signal that controls said current switching circuit to be in a conductive state when a voltage appearing across terminals of said current switching circuit does not exceed the switching voltage of said active elements, and controls said current switching circuit to be in a cutoff state when the voltage appearing across the terminals of said current switching circuit exceeds the switching voltage of said active elements.

6. The current bypass circuit used in a semiconductor integrated circuit according to claim 2 wherein said current bypass circuit comprises a first terminal connected to the reference potential, a second terminal connected to said substrate, third and fourth terminals connected to a control voltage supply, said current switching circuit, and a control circuit;

said current switching circuit comprises a first MOS transistor having a drain and a source connected to at least one of the first terminal and the second terminal, having a gate connected to at least one of the third terminal and the fourth terminal, and a resistance element connected between the gate and at least one of the third terminal and the fourth terminal, for turning-on and turning-off responsive to a control signal from said control circuit; and said control circuit comprises a second MOS transistor having a gate connected to said control voltage supply for sending a control signal that switches said current switching circuit into a conductive state when an input voltage applied across the first and second terminals of said current switching circuit is no larger than a switching voltage of said first MOS transistor, and switches said current switching circuit into a cutoff state when the voltage across the first and second terminals of said current switching circuit exceeds a turn-on voltage of said first MOS transistor.

7. The current bypass circuit used in a semiconductor integrated circuit according to claim 6 wherein said resistance element is a third MOS transistor.

* * * * *